United States Patent
Malik et al.

(10) Patent No.: US 10,781,341 B2
(45) Date of Patent: Sep. 22, 2020

(54) POLYIMIDE COMPOSITIONS

(71) Applicant: Fujifilm Electronic Materials U.S.A., Inc., North Kingstown, RI (US)

(72) Inventors: Sanjay Malik, Attleboro, MA (US); William A. Reinerth, Riverside, RI (US); Binod B. De, Attleboro, MA (US); Ognian Dimov, Warwick, RI (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 317 days.

(21) Appl. No.: 14/607,233

(22) Filed: Jan. 28, 2015

(65) Prior Publication Data

US 2015/0219990 A1 Aug. 6, 2015

Related U.S. Application Data

(60) Provisional application No. 61/934,337, filed on Jan. 31, 2014, provisional application No. 61/952,254, filed on Mar. 13, 2014.

(51) Int. Cl.

| C09D 179/08 | (2006.01) |
|---|---|
| C08G 73/10 | (2006.01) |
| G03F 7/40 | (2006.01) |
| G03F 7/38 | (2006.01) |
| G03F 7/038 | (2006.01) |

(52) U.S. Cl.
CPC ....... *C09D 179/08* (2013.01); *C08G 73/1067* (2013.01); *G03F 7/0387* (2013.01); *G03F 7/0388* (2013.01); *G03F 7/38* (2013.01); *G03F 7/40* (2013.01); *Y10T 428/31721* (2015.04)

(58) Field of Classification Search
CPC . C08G 73/1067; C09D 179/08; G03F 7/0387; G03F 7/0388; G03F 7/38; G03F 7/40; Y10T 428/2933; Y10T 428/31721
See application file for complete search history.

(56) References Cited

U.S. PATENT DOCUMENTS

| 4,656,116 A * | 4/1987 | Rohde ............ C08L 79/08 430/196 |
| 5,322,920 A | 6/1994 | Furutani |
| 5,478,915 A | 12/1995 | Amone et al. |
| 5,856,059 A * | 1/1999 | Hagiwara ............ C08G 73/10 430/196 |
| 6,139,926 A | 10/2000 | Auman et al. |
| 6,599,675 B2 | 7/2003 | Kamada et al. |
| 2001/0056174 A1 | 12/2001 | Okada et al. |
| 2004/0235992 A1 | 11/2004 | Okada et al. |

(Continued)

FOREIGN PATENT DOCUMENTS

| EP | 0 626 412 | 11/1994 | ............ C08G 73/10 |
| JP | H 06-329794 | 11/1994 | ............ C08G 73/10 |

(Continued)

OTHER PUBLICATIONS

International Search Report and Written Opinion for International Application No. PCT/US2015/013252 dated Jun. 24, 2015 (17 pages).

(Continued)

*Primary Examiner* — John D Freeman
(74) *Attorney, Agent, or Firm* — Fish & Richardson P.C.

(57) ABSTRACT

This disclosure relates to a polyimide polymer that includes the reaction product of: (a) at least one diamine selected from the group consisting of a diamine of Structure (Ia) and a diamine of Structure (Ib),

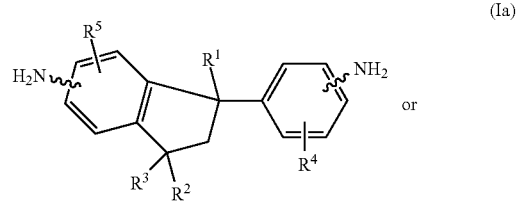

(Ia)

or

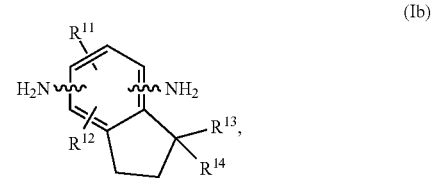

(Ib)

(b) at least one diamine of Structure (II),

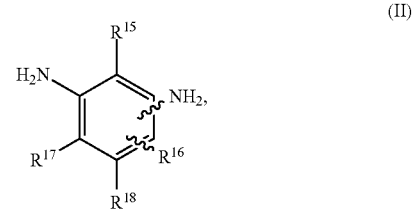

(II)

(c) at least one tetracarboxylic acid dianhydride, and (d) at least one compound containing a first functional group reactive with an amine or an anhydride and at least a second functional group selected from the group consisting of a substituted or unsubstituted linear alkenyl group and a substituted or unsubstituted linear alkynyl group. Each variable in the above formulas is defined in the specification.

33 Claims, No Drawings

(56) References Cited

U.S. PATENT DOCUMENTS

| | | | |
|---|---|---|---|
| 2005/0048297 A1* | 3/2005 | Fukuda | B32B 15/08 |
| | | | 428/458 |
| 2008/0020217 A1* | 1/2008 | Makinoshima | C08J 3/205 |
| | | | 428/473.5 |
| 2008/0146692 A1* | 6/2008 | Uehara | C08F 290/14 |
| | | | 522/134 |
| 2014/0343199 A1* | 11/2014 | Malik | C08K 5/0025 |
| | | | 524/109 |

FOREIGN PATENT DOCUMENTS

| | | | |
|---|---|---|---|
| JP | 2008-139329 | 6/2008 | G03F 7/023 |
| WO | WO 97/45497 | 12/1997 | C09D 179/08 |

OTHER PUBLICATIONS

Supplementary European Search Report for European Application No. EP 15 74 3761 dated Jun. 29, 2017 (7 pages).
First Office Action from the Chinese Patent Office for Chinese Application No. 201580005690.2 dated Feb. 24, 2018.
Japanese Notification of Reasons for Refusal for Japanese Application No. 2016-549435 dated Sep. 25, 2018 and its machine English translation.
Second Office Action from the Chinese Patent Office for Chinese Application No. 201580005690.2 dated Jan. 4, 2019.

* cited by examiner

POLYIMIDE COMPOSITIONS

CROSS-REFERENCE TO RELATED APPLICATIONS

The present application claims priority to U.S. Provisional Application Ser. No. 61/934,337, filed on Jan. 31, 2014 and U.S. Provisional Application Ser. No. 61/952,254, filed on Mar. 13, 2014, the contents of which are hereby incorporated by reference in its entirety.

BACKGROUND OF THE DISCLOSURE

The continued expansion of mobile computing applications requires the packing of ever growing levels of computing power in smaller device footprints. Designers of semiconductor devices are relying on the use of a variety of new chip architectures to meet the new device requirements. These new architectures include flip chip wafer bumping using copper pillars as well as approaches employing through silicon vias (TSV) such as three-dimensional integrated circuits (3D IC) in which wafers are thinned, the resulting dies are stacked and then connected by TSV and 2.5D interposer designs. These approaches pose significant challenges not only for the designers of these new IC architectures, but for the designers of the packaging materials that will be used for these devices.

Material requirements for packaging applications are continuously evolving as these new, advanced devices are relying heavily on wafer level packaging (WLP) and 3D integration. While there are a number of traditional packaging materials that have been employed through the years, polyimides, due to their excellent electrical, mechanical and thermal properties, have been the material of choice for semiconductor packaging applications. However, drawbacks of conventional polyimides include high cure temperatures (>350° C.), high post-cure shrinkage and high levels of moisture absorption. This high shrinkage leads to cured polyimide films having high residual stress which leads to bowing of the silicon wafer. The next generation chip architectures employing 3D integration require that the silicon wafers be thinned down up to 20 µm in most advanced applications in order to satisfy requirements for vertical integration. These thinned wafers are extremely fragile and excessive residual stress in the packaging material used will be catastrophic. The next generation packaging materials must be designed so as to impart minimal stress on the wafer. For this reason, low cure temperature and low post-cure shrinkage are among the critical requirements for advanced packaging materials.

Other traditional packaging materials, such as epoxies and BCB, can be cured at lower temperatures (<250° C.) and have lower residual stress than polyimides. Unfortunately, these materials suffer from their own limitations such as poor mechanical properties including a high coefficient of thermal expansion (CTE). Semiconductor substrates such as metals (aluminum, copper) and $SiO_2$ have low CTE. A packaging material with a high CTE creates a large thermal mismatch with the underlying substrate, which can lead to warpage and delamination of the packaging material.

Other limitations of conventional packaging materials include poor solubility and/or processability. Some packaging materials which have low residual stress and low CTE are only soluble in polar, aprotic solvents (NMP, DMAc) that are not acceptable to semiconductor manufacturers. Of those packaging materials that are soluble in acceptable solvents, most are not able to be coated using flexible application methods such as inkjet technology.

The demands being placed on advanced packaging materials are stringent. Presently, there exists no single material that satisfies all of the design requirements of next generation WLP applications. Table 1 shows the performance targets for next generation packaging materials and where each class of traditional packaging materials fails to meet the requirements.

TABLE 1

| | Performance Targets | | Material platform Conventional | | | |
|---|---|---|---|---|---|---|
| Criteria | | Target | PI/PBO | Epoxy | BCB | Siloxane |
| Cure Temperature | | <170° C. | X | P | P | M |
| Low Stress | | <20 MPa | X | M | M | M |
| CTE | | <60 ppm/° C. | M | P | P | X |
| Film Shrinkage | | <5% | X | M | M | M |
| Soluble in Semiconductor Friendly Solvents | | No NMP | P | M | M | M |
| Resolution | | <5 microns | M | M | P | M |
| Tensile Elongation at Break | | >20% | M | P | X | X |
| Water Uptake | | <0.5% | P | M | M | M |
| Ink Jet Capability | | Yes | P | X | X | X |

X: Does not meet target
P: Partially meets target
M: Meets target

There exists a need for new packaging materials suitable for WLP and 3D integration applications. These materials must be cured at low temperature, have low CTE and impart low residual stress on the thinned wafers making up the next generation devices. These materials must also be readily soluble in environmentally- and semiconductor-friendly solvents and possess the application flexibility to be applied by a variety of coating methods (inkjet, slit coating, spray coating, etc.).

BRIEF SUMMARY OF THE DISCLOSURE

One objective of this invention is to provide novel polymers, polymeric compositions and processes employing them that will meet requirements for advanced packaging applications. More particularly, this disclosure describes a polyimide polymer containing the reaction product of components (a), (b), (c), and (d) below: (a) at least one diamine selected from the group consisting of a diamine of Structure (Ia) and a diamine of Structure (Ib),

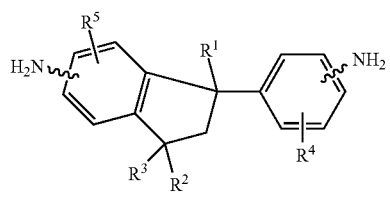

(Ia)

and

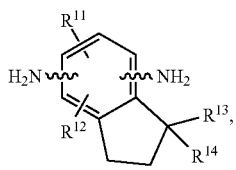

(Ib)

(b) at least one diamine of Structure II,

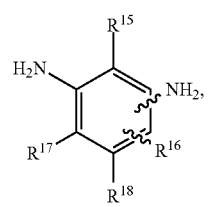

(II)

(c) at least one tetracarboxylic acid dianhydride, and (d) at least one compound containing a first functional group reactive with an amine or an anhydride and at least a second functional group selected from the group consisting of a substituted or unsubstituted linear alkenyl group and a substituted or unsubstituted linear alkynyl group, in which each of $R^1$, $R^2$, $R^3$, $R^4$, $R^5$, $R^{11}$, $R^{12}$, $R^{13}$, $R^{14}$, $R^{15}$, $R^{16}$, $R^{17}$ and $R^{18}$, independently, is H, a substituted or unsubstituted $C_1$-$C_6$ linear or branched alkyl group, or $C_5$-$C_7$ cycloalkyl group, provided that at least three of $R^{15}$, $R^{16}$, $R^{17}$ and $R^{18}$ are not hydrogen.

In this disclosure, the term "reaction product" refers to a product formed from one or more synthetic steps. In general, the reactions that can be used to form a polyimide polymer described herein as a reaction product can include at least condensation, imidization, and endcapping reactions. In some embodiments, a reaction product can be formed by reacting diamines and dianhydrides described herein through condensation, imidization and endcapping reactions in this order. In some embodiments, a reaction product can be formed by reacting diamines and dianhydrides described herein through condensation, endcapping and imidization reactions in this order. In some embodiments, the condensation and endcapping reactions can be performed in one step, followed by imidization. In other embodiments, the condensation, and endcapping reactions can be performed in two steps, followed by imidization.

In some embodiments, this disclosure features compositions containing components (A), (B), (C), and (D) below: (A) a polyimide polymer, containing the reaction product of: (a) at least one diamine selected from the group consisting of a diamine of Structure (Ia) and a diamine of Structure (Ib),

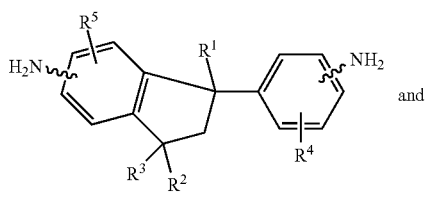

(Ia)

and (Ib)

(b) at least one diamine of Structure (IIe),

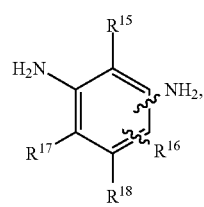

(IIe)

(c) at least one tetracarboxylic acid dianhydride, and (d) at least one compound containing (a) a first functional group reactive with an amine or an anhydride and (b) at least a second functional group selected from the group consisting of a substituted or unsubstituted linear alkenyl group and a substituted or unsubstituted linear alkynyl group, in which each of $R^1$, $R^2$, $R^3$, $R^4$, $R^5$, $R^{11}$, $R^{12}$, $R^{13}$, $R^{14}$, $R^{15}$, $R^{16}$, $R^{17}$ and $R^{18}$, independently, is H, a substituted or unsubstituted $C_1$-$C_6$ linear or branched alkyl group, or $C_5$-$C_7$ cycloalkyl group, provided that at least two of $R^{15}$, $R^{16}$, $R^{17}$ and $R^{18}$ are not hydrogen; (B) at least one reactive functional compound having at least one functional group capable of reacting with the second functional group on the polyimide polymer in the presence of an initiator; (C) an initiator capable of initiating a reaction between the second functional group on the polyimide polymer and the reactive functional compound; and (D) at least one solvent.

In some embodiments, this disclosure features a process that includes coating a substrate with a composition described herein to form a coated substrate having a film on the substrate, and baking the coated substrate to form a coated substrate having a dried film.

In some embodiments, this disclosure features an article formed by a process described herein. Examples of such articles include a semiconductor substrate, a flexible film for electronics, a wire isolation, a wire coating, a wire enamel, or an inked substrate. In some embodiments, this disclosure features a semiconductor device containing the article described above. For example, the semiconductor device can be an integrated circuit, a light emitting diode, a solar cell, and a transistor.

In some embodiments, component (a) is at least one diamine of Structure (Ia). In such embodiments, the amino group on the indane ring in Structure (Ia) can be at the 5 position, the other amino group in Structure (Ia) can be at the 4 position, each of $R^1$, $R^2$, and $R^3$ can be $CH_3$, and each of $R^4$ and $R^5$ can be H.

In some embodiments, the two amino groups in Structure (II) are at meta positions relative to each other. In such embodiments, each of $R^{15}$, $R^{18}$, and $R^{17}$ can be $CH_3$ and $R^{18}$ can be H.

In some embodiments, the first functional group reactive to an amine can include an anhydride group, an acid halide group, an epoxy group, or an isocyanate group. In some embodiments, the first functional group reactive to an anhydride can include an amino group, a hydroxyl group, or a thiol group.

In some embodiments, the molar ratio of components (a) and (b) to component (c) can range from 1.01 to 1.4 or from 0.8 to 1 (e.g., from 0.8 to 0.99).

In some embodiments, component (B) can include a vinyl group, an allyl group, a vinyl ether group, a propenyl ether group, a (meth)acryloyl group, an epoxy group, a SiH group, or a thiol group.

In some embodiments, the composition includes other additives including, but not limited to, adhesion promoters, plasticizers, surfactants, dyes, etc.

In some embodiments, this disclosure concerns a process to provide a film on a substrate using the compositions of this disclosure. In some embodiments, this disclosure concerns a process to provide a film that has been rendered insoluble in a developer. In some embodiments, this disclosure concerns a lithographic process for forming a relief image on a substrate.

DETAILED DESCRIPTION OF THE DISCLOSURE

Definition of Terms

In the context of this disclosure, the term "tetravalent group" used in relation to the polyimide polymer or monomers used to synthesize the polymer means that the element contains four bonds (tetravalent) that function as part of the polymer backbone or will become part of an imide group after processing. Other substituents, if allowed, can be present but are not of the type that will be integrated into the backbone or the imide group. The term "divalent group" means that the group is linked to two designated moieties. Any allowed substituents on the divalent group are not of the same type as the designated moieties.

The terms "one or more" and "at least one" are used interchangeably. The terms "films" and "coatings" can be used interchangeably.

The terms "moieties" and "groups" are used interchangeably. Likewise their singulars are used interchangeably.

The term "tacky" is used to describe a film that has been formed on a substrate that still has substantial solvent content but is no longer pourable or highly flowable.

Description of Polyimide Polymers

One embodiment of this disclosure concerns a polyimide polymer containing the reaction product (e.g., a condensation and imidization product) of:

(a) at least one diamine of Structure (Ia) and/or a diamine of Structure (Ib), (b) at least one diamine of Structure (II), (c) at least one tetracarboxylic acid dianhydride, and (d) at least one compound containing a first functional group reactive with an amine or an anhydride and at least one second functional group selected from a substituted or unsubstituted linear alkenyl group and a substituted or unsubstituted linear alkynyl group,

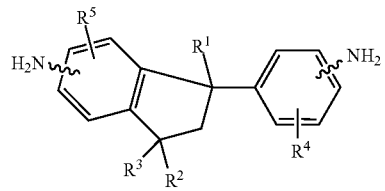
Structure (Ia)

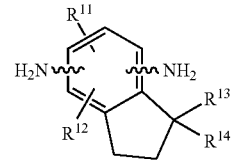
Structure (Ib)

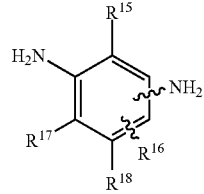
Structure (II)

in which each of $R^1$, $R^2$, $R^3$, $R^4$, $R^5$, $R^{11}$, $R^{12}$, $R^{13}$, $R^{14}$, $R^{15}$, $R^{16}$, $R^{17}$ and $R^{18}$, independently, is H, a substituted or unsubstituted $C_1$-$C_6$ linear or branched alkyl group, or $C_5$-$C_7$ cycloalkyl group, provided that at least three of $R^{15}$, $R^{16}$, $R^{17}$ and $R^{18}$ are not hydrogen.

Examples of the substituted or unsubstituted $C_1$-$C_6$ linear or branched alkyl groups in $R^1$, $R^2$, $R^3$, $R^4$, $R^5$, $R^{11}$, $R^{12}$, $R^{13}$, and $R^{14}$ include, but are not limited to methyl, ethyl, propyl, isopropyl, butyl, isobutyl, t-butyl, amyl, hexyl, and 2-methylhexyl. Examples of the $C_5$-$C_7$ cycloalkyl group in $R^1$, $R^2$, $R^3$, $R^4$, $R^5$, $R^{11}$, $R^{12}$, $R^{13}$, and $R^{14}$ include, but are not limited to, cyclopentyl, cyclohexyl, and cycloheptyl.

Specific examples of diamines of Structure (Ia) or (Ib) include, but are not limited to, 1-(4-aminophenyl)-1,3,3-trimethylindan-5-amine (alternative names including 4,4'-[1,4-phenylene-bis(1-methylethylidene)]bisaniline, 1-(4-aminophenyl)-1,3,3-trimethyl-2H-inden-5-amine, 1-(4-aminophenyl)-1,3,3-trimethyl-indan-5-amine, [1-(4-aminophenyl)-1,3,3-trimethyl-indan-5-yl]amine, and 1-(4-aminophenyl)-2,3-dihydro-1,3,3-trimethyl-1H-inden-5-amine), 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1-dimethylindan, 4,7-diamino-1,1-dimethylindan, 5,7-diamino-1,1,4-trimethylindan, 5,7-diamino-1,1,6-trimethylindan, and 5,7-diamino-1,1-dimethyl-4-ethylindan.

Examples of the substituted or unsubstituted $C_1$-$C_6$ linear or branched alkyl groups in $R^{15}$, $R^{16}$, $R^{17}$ and $R^{18}$ include, but are not limited to methyl, ethyl, propyl, isopropyl, butyl, isobutyl, t-butyl, amyl, hexyl, and 2-methylhexyl. Examples of the $C_5$-$C_7$ cycloalkyl group in $R^{15}$, $R^{16}$, $R^{17}$ and $R^{18}$ include, but are not limited to, cyclopentyl, cyclohexyl, and cycloheptyl.

Examples of diamines of Structure (II) include, but are not limited to, 2,3,5,6-tetramethylphenylenediamine, 2,4-diamino-1,3,5-trimethylbenzene, 2,4-diamino-1,3,5-triethylbenzene, 2,4-diamino-3,5-dimethyl-1-ethylbenzene, 2,4-diamino-1,5-dimethyl-3-ethylbenzene 2,4-diamino-1,3,5-triisopropylbenzene, 2,3,5,6-tetraisopropylphenylenediamine and 2,4-diamino-1,3,5,6-tetramethylbenzene.

The polyimide of this disclosure can be prepared by diamines in addition to the diamines of Structure (Ia), (Ib), or (II). For example, additional diamines that can be used to prepare the polyimide of this disclosure can be those of the following structure: $H_2N-X^3-NH_2$, where $X^3$ is a divalent organic group selected from the group consisting of:
 a) a substituted or unsubstituted $C_6$-$C_{18}$ mononuclear or polynuclear aromatic group,
 b) a substituted or unsubstituted methylene or ethylene group,
 c) a substituted or unsubstituted $C_3$-$C_{20}$ linear, branched, monocyclic or polycyclic alkylene group,
 d) a substituted or unsubstituted heterocyclic group,
 e) a linear or branched alkylene group containing one or more oxygen atoms, sulfur atoms, or $NR^{91}$ groups within the chain, wherein $R^{91}$ is a $C_1$-$C_3$ alkyl group,
 f) a divalent group of Structure (III-a), (III-b), or (III-c),

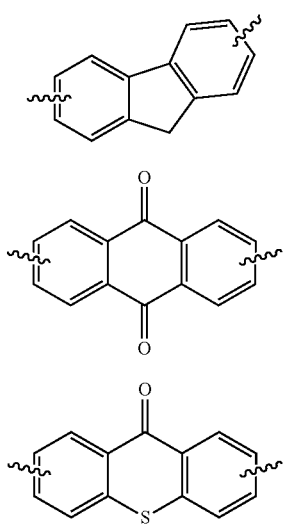

(III-a)

(III-b)

(III-c)

g) a divalent group $[A^1$-$(B^1)_{n1}$-$A^2]$ where n1 is an integer ranging from 1 to 5, $A^1$ and $A^2$ are independently selected from the group consisting of:
  1. a substituted or unsubstituted $C_5$-$C_{18}$ cyclic or polycyclic aliphatic group, and
  2. a substituted or unsubstituted $C_6$-$C_{18}$ mononuclear or polynuclear aromatic group,
 and $B^1$ is a divalent linking group selected from the group consisting of:
  1. a single bond,
  2. a substituted or unsubstituted $C_1$-$C_{20}$ linear, branched, monocyclic or polycyclic alkylene group,
  3. a substituted or unsubstituted $C_2$ alkenylene group,
  4. a $C_2$ alkynylene group,
  5. a substituted or unsubstituted $C_6$-$C_{18}$ mononuclear or fused polynuclear aromatic group,
  6. an oxygen atom,
  7. a sulfur atom,
  8. a —(C=O)— group,
  9. a —[S(=O)$_2$]— group,
  10. a —(S=O)— group,
  11. a —[C(=O)O]— group,
  12. a —[C(=O)NH]— group, and
  13. a —[O(C(R$^{20}$)$_2$(CR$^{21}$)$_2$O)$_{n2}$]— group, where n2 is an integer ranging from 1 to 6 and $R^{20}$ and $R^{21}$ are independently a hydrogen atom or a substituted or unsubstituted $C_1$-$C_6$ linear, or branched alkyl group (e.g., a partially or fully halogen substituted $C_1$-$C_6$ alkyl group).

Examples of divalent organic functional groups $B^1$ include, but are not limited to, those shown below:

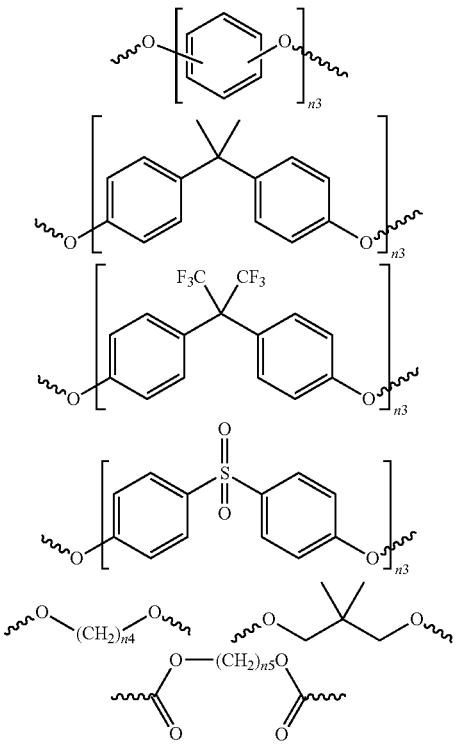

in which each of n3, n4 and n5, independently, is an integer ranging from 1 to 6.

Suitable examples of linear or branched alkylene groups containing one or more oxygen atoms, sulfur atoms, or $NR^{91}$ groups within the chain include, but are not limited to,

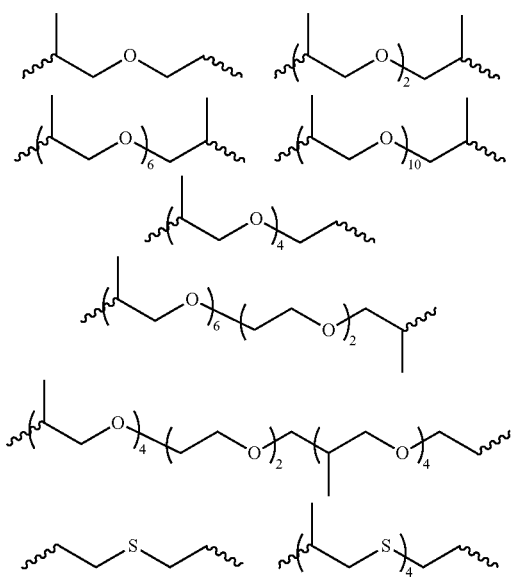

-continued

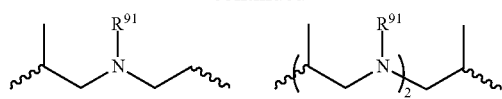

in which each $R^{91}$, independently, is a $C_1$-$C_3$ alkyl group (e.g., methyl, ethyl, propyl, or isopropyl).

Suitable examples of $X^3$ include, but are not limited to, the following moieties:

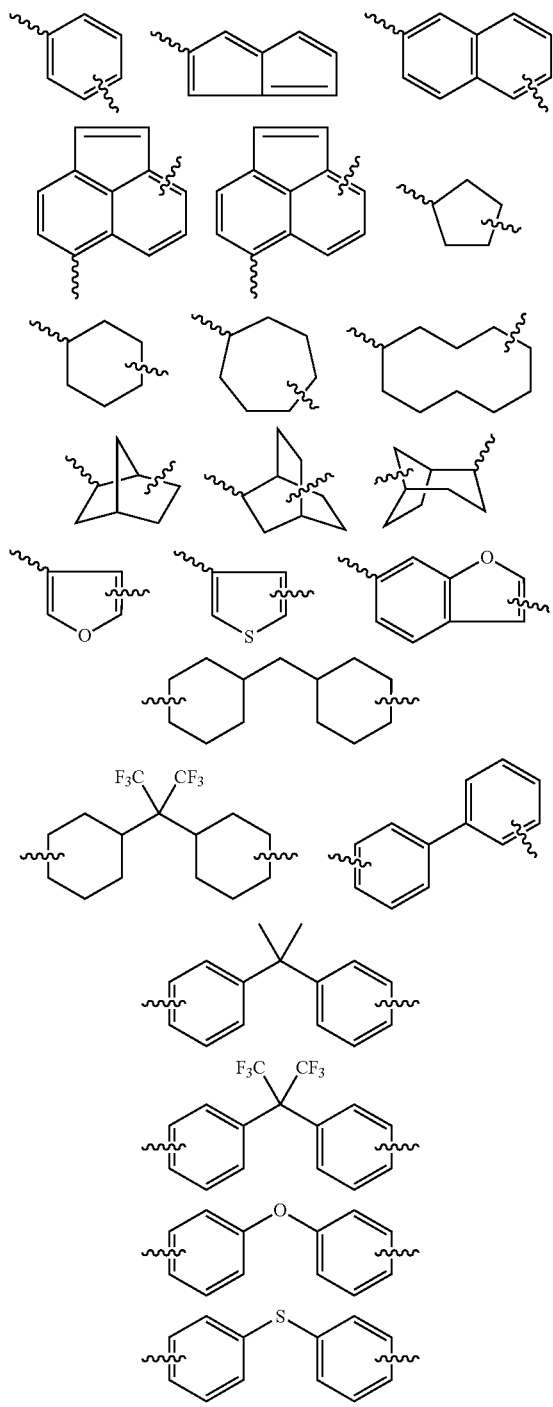

-continued

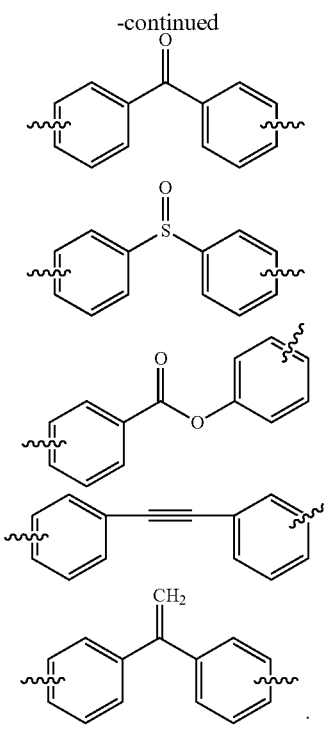

Examples of suitable diamines having the $X^3$ moiety include, but are not limited to, p-phenylenediamine, m-phenylenediamine, o-phenylenediamine, 3-methyl-1,2-benzene-diamine, 1,5-diaminonaphthalene, 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,2-diaminocyclohexane, 1,4-diaminocyclohexane, 1,3-cyclohexanebis(methylamine), 5-amino-1,3,3-trimethyl cyclohexanemethanamine, 2,5-diaminobenzotrifluoride, 3,5-diaminobenzotrifluoride, 1,3-diamino-2,4,5,6-tetrafluorobenzene, 4,4'-oxydianiline, 3,4'-oxydianiline, 3,3'-oxydianiline, 3,3'-diaminodiphenylsulfone, 4,4'-diaminodiphenylsulfones, 4,4'-isopropylidenedianiline, 4,4'-diaminodiphenylmethane, 2,2-bis(4-aminophenyl)propane, 4,4'diaminodiphenyl propane, 4,4'-diaminodiphenyl sulfide, 4,4'-diaminodiphenylsulfone, 4-aminophenyl-3-aminobenzoate, 2,2'-dimethyl-4,4'-diaminobiphenyl, 3,3'-dimethyl-4,4'-diaminobiphenyl, 2,2'-bis(trifluoromethyl)benzidine, 3,3'-bis(trifluoromethyl)benzidine, 2,2-bis[4-(4-aminophenoxy phenyl)]hexafluoropropane, 2,2-bis(3-amino-4-methylphenyl)-hexafluoropropane, 2,2-bis(3-aminophenyl)-1,1,1,3,3,3-hexafluoropropane, 1,3-bis-(4-aminophenoxy)benzene, 1,3-bis-(3-aminophenoxy)benzene, 1,4-bis-(4-aminophenoxy)benzene, 1,4-bis-(3-aminophenoxy)benzene, 1-(4-aminophenoxy)-3-(3-aminophenoxy)benzene, 2,2'-bis-(4-phenoxyaniline)isopropylidene, N,N-bis(4-aminophenyl)aniline, bis(p-beta-amino-t-butylphenyl)ether, p-bis-2-(2-methyl-4-aminopentyl)benzene, p-bis(1,1-dimethyl-5-aminopentyl)benzene, 3,3'-dimethyl-4,4'-diaminobiphenyl, 3,3'-dimethoxybenzidine, 4,4'-diaminobenzophenone, 3'-dichlorobenzidine, 2,2-bis[4-(4-aminophenoxy)phenyl]propane, 4,4'-[1,3-phenylenebis(1-Methyl-ethylidene)]bisaniline, 4,4'-[1,4-phenylenebis(1-methyl-ethylidene)]bisaniline, 2,2-bis[4-(4-aminophenoxy)phenyl]sulfone, 2,2-bis[4-(3-aminophenoxy)benzene], 1,4-bis(4-aminophenoxy)benzene, 1,3-bis(4-aminophenoxy)benzene, (1,3'-bis(3-aminophenoxy)benzene, 2,6-diamino-9H-thioxanthen-9-one, 2,6-diaminoanthracene-9,10-dione, and 9H-fluorene-2,6-diamine.

Examples of preferred diamines having the $X^3$ moiety include, but are not limited to, m-phenylenediamine, 1,5-diaminonaphthalene, 2,5-diaminobenzotrifluoride, 3,5-diaminobenzotrifluoride, 4,4'-oxydianiline, 4,4'-diaminodiphenylsulfones, 2,2-bis(4-aminophenyl)propane, 4-aminophenyl-3-aminobenzoate, 2,2-bis[4-(4-aminophenoxy phenyl)]hexafluoropropane, 2,2-bis(3-amino-4-methylphenyl)-hexafluoropropane, 2,2-bis(3-aminophenyl)-1,1,1,3,3,3-hexafluoropropane, 1,3-bis-(4-aminophenoxy)benzene, 1,3-bis-(3-aminophenoxy)benzene, 1-(4-aminophenoxy)-3-(3-aminophenoxy)benzene, 2,2'-bis-(4-phenoxyaniline)isopropylidene, 3,3'-dimethyl-4,4'-diaminobiphenyl, 3,3'-dimethoxybenzidine, 4,4'-diaminobenzophenone, 2,2-bis[4-(4-aminophenoxy)phenyl] propane, 4,4'-[1,3-phenylenebis(1-Methyl-ethylidene)] bisaniline, 4,4'-[1,4-phenylenebis(1-methyl-ethylidene)] bisaniline, 2,2-bis[4-(4-aminophenoxy)phenyl]sulfone, 2,2-bis[4-(3-aminophenoxy)benzene], 1,3'-bis(3-aminophenoxy)benzene, 2,6-diamino-9H-thioxanthen-9-one, and 2,6-diaminoanthracene-9,10-dione.

The amount of diamine of Structure (Ia) can be 0% to 100% of the amount of diamines of Structures (Ia) and (Ib). The amount of diamine of Structure (Ib) can be 0% to 100% of the amount of diamines of Structures (Ia) and (Ib).

In some embodiments, the molar percentage of the diamines of Structures (Ia) and (Ib) in the total amount of diamines is at least about 30% (e.g., at least about 35%, at least about 40%, at least about 45%, or at least about 50%) to at most about 80% (e.g., at most about 75% or at most about 70%).

In some embodiments, the molar percentage of the diamines of Structure (II) in the total amount of diamines is at least about 30% (e.g., at least about 35%, at least about 40%, at least about 45%, or at least about 50%) to at most about 80% (e.g., at most about 75% or at most about 70%).

In some embodiments, the total molar percentage of the diamines of Structures (Ia), (Ib), and (II) in the total amount of diamines used to prepare the polyimide polymer is from at least about 60% (e.g., at least about 65%, at least about 70%, or at least about 75%) to at most about 100% (e.g., at most about 95%, at most about 90%, or at most about 85%).

In some embodiments, the molar percentage of the diamines of Structures (Ia) and (Ib) in the total amount of diamines of Structures (Ia), (Ib), and (II) is at least about 30% (e.g., at least about 35%, at least about 40%, at least about 45%, or at least about 50%) to at most about 80% (e.g., at most about 75% or at most about 70%).

In some embodiments, the molar percentage of the diamines of Structure (II) in the total amount of diamines of Structure (Ia), (Ib), and (II) is at least about 30% (e.g., at least about 35%, at least about 40%, at least about 45%, or at least about 50%) to at most about 80% (e.g., at most about 75% or at most about 70%).

The diamines of Structures (Ia) and/or Structures (Ib) and Structure (II) (and any additional optional diamines) are reacted with at least one tetracarboxylic acid dianhydride. Preferred tetracarboxylic acid dianhydrides have the Structure (V) with a moiety Y.

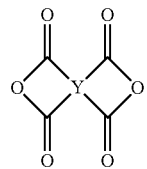

Structure (V)

The moiety Y is a tetravalent organic group selected from the group consisting of:

a) a substituted or unsubstituted $C_6$-$C_{18}$ mononuclear or fused polynuclear aromatic group, b) a substituted or unsubstituted $C_2$-$C_{18}$ linear, branched, cyclic or fused polycyclic alkylene group, c) a substituted or unsubstituted heterocyclic group, d) a tetravalent group of Structure (VI-a), (VI-b), (VI-c), (VI-d), (VI-e), (VI-f), (VI-g), (VI-h), (VI-i), or (VI-j), where $R^{31}$ to $R^{41}$ are independently a hydrogen atom or a substituted or unsubstituted $C_1$-$C_{10}$ linear or branched alkyl group (e.g., a partially or fully halogen substituted $C_1$-$C_{10}$ alkyl group) and $L^3$ to $L^6$ are independently selected from the group consisting of an unsubstituted or substituted carbon atom, an oxygen atom, a sulfur atom, a —(C=O)— group, a —[S(=O)$_2$]— group and a —(S=O)— group,

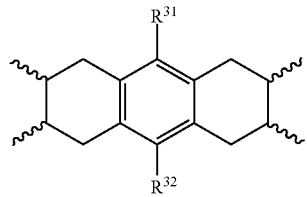

Structure (VI-a)

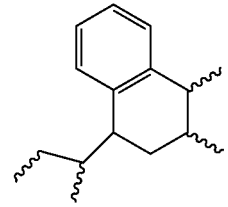

Structure (VI-b)

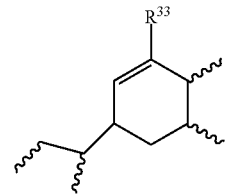

Structure (VI-c)

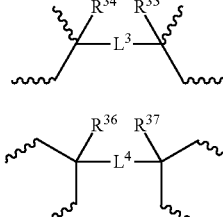

Structure (VI-d)

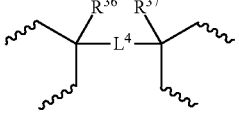

Structure (VI-e)

Structure (VI-f)

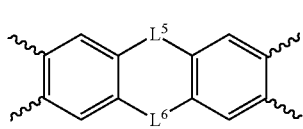

Structure (VI-g)

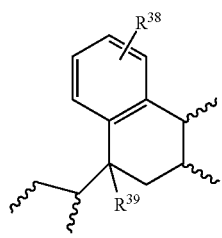

Structure (VI-h)

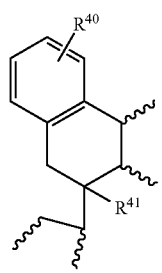

Structure (VI-i)

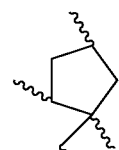

Structure (VI-j)

e) a tetravalent group [$D^1$-$L^1$-$D^2$] where, $D^1$ and $D^2$ are independently selected from the group consisting of:
 1. a substituted or unsubstituted $C_5$-$C_{18}$ monocyclic or polycyclic aliphatic group, and
 2. a substituted or unsubstituted $C_6$-$C_{18}$ mononuclear or polynuclear aromatic group,
and $L^1$ is a divalent linking group selected from the group consisting of:
 1. a single bond,
 2. a substituted or unsubstituted $C_1$-$C_{20}$ linear, branched, monocyclic or polycyclic alkylene group,
 3. a substituted or unsubstituted $C_2$ alkenylene group,
 4. a $C_2$ alkynylene group,
 5. a substituted or unsubstituted $C_6$-$C_{18}$ mononuclear or fused polynuclear aromatic group,
 6. an oxygen atom,
 7. a sulfur atom,
 8. a —(C=O)— group,
 9. a —[S(=O)$_2$]— group,
 10. a —(S=O)— group,
 11. a —[C(=O)O]— group,
 12. a —[C(=O)NH]— group, and
 13. a —[O(C(R$^{61}$)$_2$(CR$^{62}$)$_2$O)$_{n3}$]— group, where n3 ranges from 1 to about 6 and R$^{61}$ and R$^{62}$ are independently a hydrogen atom or a substituted or unsubstituted $C_1$-$C_6$ linear, or branched alkyl group (e.g., a partially or fully halogen substituted $C_1$-$C_6$ alkyl group).

Examples of divalent linking groups $L^1$ include, but are not limited to, those shown below of which each of n3, n4 and n5, independently, has the same meaning defined above:

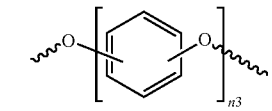

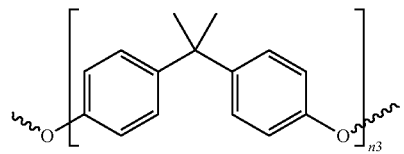

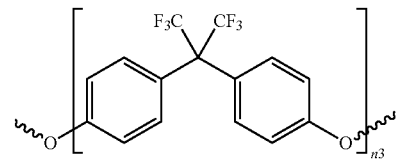

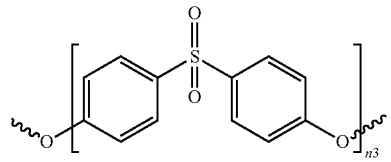

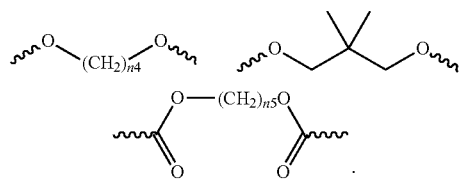

Suitable examples of Y include, but are not limited to, the following moieties:

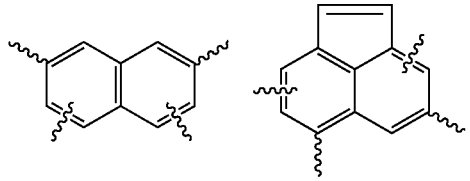

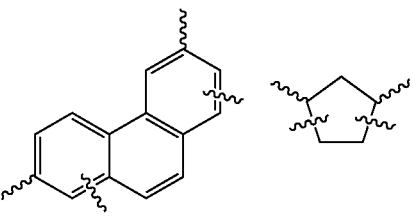

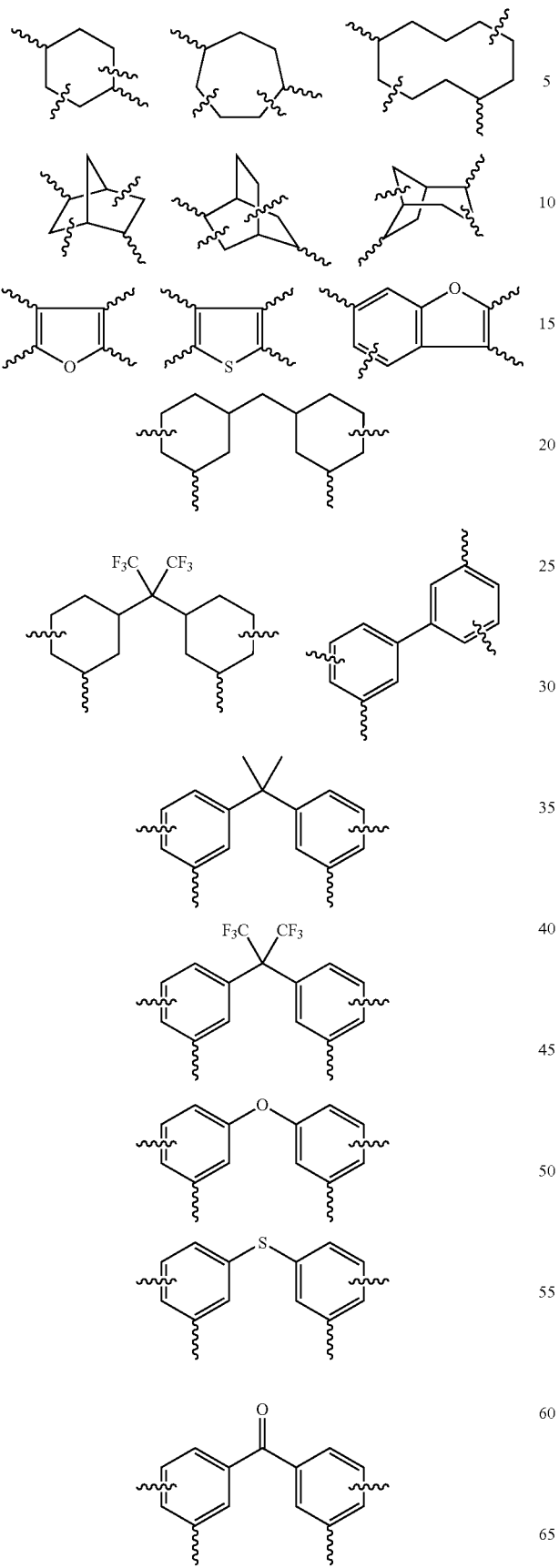
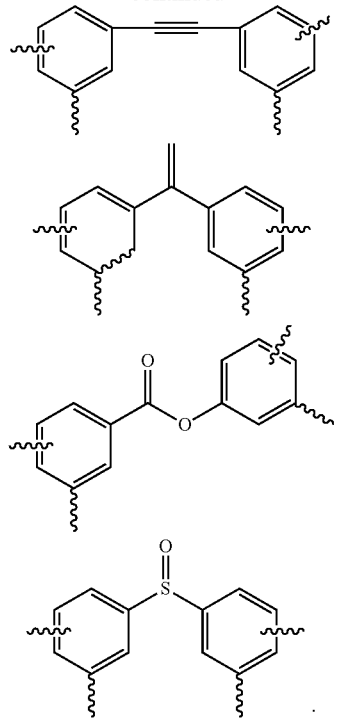

Examples of suitable tetracarboxyic acid dianhydride monomers having the Y moiety include, but are not limited to, pyromellitic dianhydride, benzene-1,2,3,4-tetracarboxylic dianhydride, 2,3,5,6-naphthalenetetracarboxylic acid dianhydride, 2,3,6,7-naphthalenetetracarboxylic acid dianhydride, 1,4,5,8-naphthalenetetracarboxylic acid dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-, 8,9,10-tetracarboxylic dianhydride, 3,4,9,10-perylenetetracarboxylic acid dianhydride, pyrazine-2,3,5,6-tetracarboxylic dianhydride, thiophene-2,3,4,5-tetracarboxylic dianhydride, 2,3,5,6-pyridinetetracarboxylic acid dianhydride, butane-1,2,3,4-tetracarboxylic acid dianhydride, 1,2,3,4-cyclopentanetetracarboxylic acid dianhydride, cyclobutane-1,2,3,4-tetracarboxylic acid dianhydride, cyclopentane-1,2,3,4-tetracarboxylic acid dianhydride, cyclohexane-1,2,4,5-tetracarboxylic acid dianhydride, norbornane-2,3,5,6-tetracarboxylic acid dianhydride, bicyclo[2.2.2]oct-7-ene-3,4,8,9-tetracarboxylic acid dianhydride, tetracyclo[4.4.1.0$^{2,5}$.0$^{7,10}$]undecane-1,2,3,4-tetracarboxylic acid dianhydride, 3,3',4,4'-benzophenone tetracarboxylic dianhydride, 2,2',3,3'-benzophenone tetracarboxylic dianhydride, 2,3,3',4'-benzophenone tetracarboxylic dianhydride, 3,3',4,4'-diphenylsulfone tetracarboxylic dianhydride, 2,2',3,3'-diphenylsulfone tetracarboxylic dianhydride, 2,3,3',4'-diphenylsulfone tetracarboxylic dianhydride, 3,3',4,4'-diphenyl ether tetracarboxylic dianhydride, 2,2',3,3'-diphenyl ether tetracarboxylic dianhydride, 2,3,3',4'-diphenyl ether tetracarboxylic dianhydride, 2,2-[bis(3,4-dicarboxyphenyl)]hexafluoropropane dianhydride, ethylene glycol bis(anhydrotrimellitate), and 5-(2,5-dioxotetrahydro)-3-methyl-3-cyclohexene-1,2-dicarboxylic anhydride.

Examples of preferred tetracarboxylic acid dianhydride monomers having the Y moiety include, but are not limitto, pyrazine-2,3,5,6-tetracarboxylic dianhydride, thiophene-2,3,4,5-tetracarboxylic dianhydride, 2,3,5,6-pyridinetetracarboxylic acid dianhydride, norbornane-2,3,5,6-tetracarboxylic acid dianhydride, bicyclo[2.2.2]oct-7-ene-3,4,8,9-tetracarboxylic acid dianhydride, tetracyclo[4.4.1.0$^{2,5}$.0$^{7,10}$]undecane-1,2,3,4-tetracarboxylic acid dianhydride, 3,3',4,4'-benzophenone tetracarboxylic dianhydride, 3,3',4,4'-diphenylsulfone tetracarboxylic dianhydride, 3,3',4,4'-diphenyl ether tetracarboxylic dianhydride, 2,3,3',4'-diphenyl ether tetracarboxylic dianhydride, 2,2-[bis(3,4-dicarboxyphenyl)]hexafluoropropane dianhydride, ethyleneglycol bis(anhydrotrimellitate), and 5-(2,5-dioxotetrahydro)-3-methyl-3-cyclohexene-1,2-dicarboxylic anhydride.

The diamines of Structures (Ia) and/or Structures (Ib) and Structure (II) are reacted with at least one tetracarboxylic acid dianhydride to yield a polyamic acid of Structure (VII):

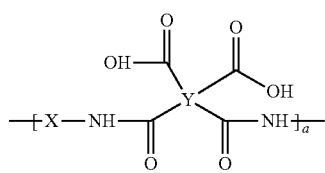

(VII)

in which some of X is X$^{1a}$ and/or X$^{1b}$, and X$^2$ with optional X$^3$, and R$^1$, R$^2$, R$^3$, R$^4$, R$^5$, R$^{11}$, R$^{12}$, R$^{13}$, R$^{14}$, R$^{15}$, R$^{16}$, R$^{17}$, R$^{18}$, and Y are as defined above.

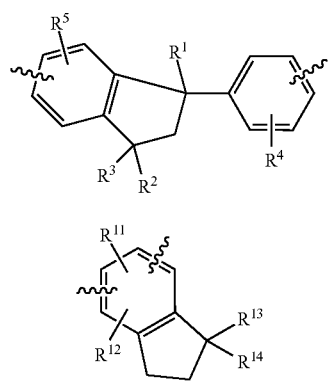

The polyamic acid of Structure (VII) can be synthesized by numerous synthetic procedures or variations of those procedures known to those skilled in the art. In general, to form a polyamic acid of Structure (VII), one can bring one or more diamines in contact with one or more tetracarboxylic acid dianhydrides in the presence of a solvent suitable to dissolve the monomers, and, preferably, the resultant polyamic acid.

In some embodiments, to prepare a polyamic acid, the diamine component and tetracarboxylic acid dianhydride component are charged into a reaction vessel by gradually charging one of the components in the form of solid or solution into a solution of the other component (complete dissolution of all materials might not occur). The method of charging both the components at the same time is advantageous in view of the productivity because the time required for charging is shortened. Generally, the reaction is carried out at about 15° C. to about 80° C. for about 1 to about 48 hours.

Suitable polymerization solvents useful in the present invention include, but are not limited to, N-methyl-2-pyrrolidone, N-ethyl-2-pyrrolidone, N-butyl-2-pyrrolidone, N-formylmorpholine, N,N-dimethylformamide, dimethylsulfoxide, gamma-butyrolactone, N,N-dimethylacetamide, tetramethylene sulfone, p-chlorophenol, m-cresol, diethyleneglycol methyl ether, methyl-3-methoxyproprionate, ethyl-3-ethoxypropionate, cyclohexanone, propylene glycol monomethyl ether acetate, and 2-chloro-4-hydroxytoluene. These solvents can be used singly or in combination of two or more. Of these solvents, preferred are N-methyl-2-pyrrolidone, gamma-butyrolactone and N,N-dimethylacetamide, with N-methyl-2-pyrrolidone being more preferred. In some embodiments, a poor solvent for the polyimide can be used in combination with these solvents in such an amount to not allow the polyamic acid to precipitate. Examples of such a poor solvent include hexane, heptane, benzene, toluene, xylene, chlorobenzene and o-dichlorobenzene. The amount of the poor solvent to be used is preferably 50 percent by weight or less (inclusive of zero) based on the total amount of the solvents. The polyamic acid thus produced can be isolated by precipitation into a non-solvent or a poor solvent and collected by filtration.

The molar ratio of diamine component(s) to tetracarboxylic acid dianhydride component(s) can be greater than 1.00. The resulting species is an amino-terminated polyamic acid (e.g., a polyamic acid of Structure (VIIa)). The molar ratio of diamine components to tetracarboxylic acid dianhydride component(s) can generally range from 1.01 to 1.40. In some embodiments, a molar ratio of diamine to tetracarboxylic acid dianhydride of about 1.05 to 1.33 is employed. In some embodiments, a molar ratio of diamine to tetracarboxylic acid dianhydride of about 1.05 to 1.25 is employed. In some embodiments, a molar ratio of diamine to tetracarboxylic acid dianhydride of about 1.05 to 1.20 is employed.

Structure (VIIa)

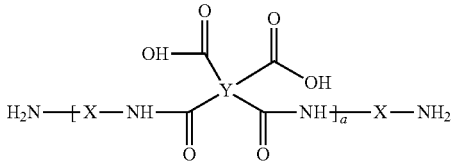

When an excess of tetracarboxylic acid dianhydride to diamine is employed, the suitable molar ratio of diamine to tetracarboxylic acid dianhydride ranges from about 0.8 to about 0.99. A preferred molar ratio of diamine to tetracarboxylic acid dianhydride ranges from about 0.83 to about 0.98. In some embodiments, the preferred molar ratio of diamine to tetracarboxylic acid dianhydride ranges from about 0.87 to about 0.98. In some embodiments, the preferred molar ratio diamine to tetracarboxylic acid dianhydride ranges from about 0.91 to about 0.98. When a molar excess of tetracarboxylic acid dianhydride is employed, an anhydride-terminated polyamic acid (e.g., a polyamic acid of Structure (VIIb)) is produced.

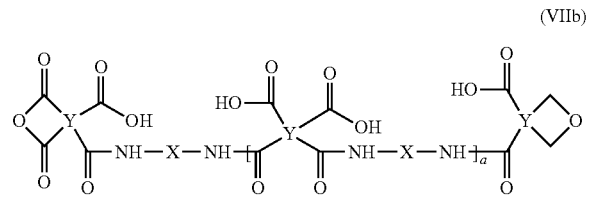

(VIIb)

Those skilled in the art will understand that there are multiple synthetic pathways to convert polyamic acids of Structures (VIIa) and (VIIb) to the polyimide polymers of this disclosure. One pathway is to imidize polyamic acids of Structures (VIIa) and (VIIb) using chemical or thermal imidization techniques, followed by reaction of the terminal group (e.g., the terminal $NH_2$ in Structure (VIIa) and the terminal anhydride in Structure (VIIb)) with a compound having a first functional group with which is reactive, and having at least one second functional group selected from a substituted or unsubstituted linear alkenyl group and a substituted or unsubstituted linear alkynyl group. Alternatively, the reaction of the terminal group in Structure (VIIa) or (VIIb) can be done first followed by the chemical or thermal imidization.

Another alternative is to include in the polymerization reaction a monoamine or monoanhydride containing at least one radical, acid reactive group, or a functional group that does not interfere with the condensation reaction that can be functionalized later, and at least one second functional group selected from a substituted or unsubstituted linear alkenyl group and a substituted or unsubstituted linear alkynyl group (e.g., aminophenol later reacted with methacryl chloride).

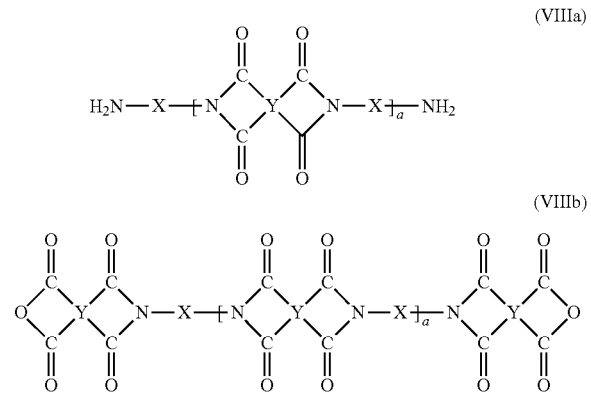

(VIIIa)

(VIIIb)

The thermal imidization can, for example, be performed in the solid state at a temperature ranging from about 100° C. to about 400° C. (e.g., from about 200° C. to about 300° C., or about 250° C.). In another embodiment, the thermal imidization can be performed in a solution at a temperature ranging from about 100° C. to about 250° C. When the heat treatment is performed within this temperature range, the imidization reactivity can be controlled within a desired range, minimizing non-reacted polyamic acid. In some embodiments, the thermal imidization in this manner is best done before reaction of the polymer terminal groups.

The polyamic acid can also be dehydrated using an azeotroping thermal procedure. An example of this reaction is described in U.S. Pat. No. 5,478,915. For example, after the synthesis of the polyamic acid is complete, toluene is added, and the solution is azeotropically refluxed at 155° C., collecting the water in a Dean-Stark trap.

In some embodiments, polyimide of Structure (VIIIa) or (VIIIb) is produced by chemical imidization. For example, a chemical imidizing agent (e.g., a dehydrating agent) can be added to the polyamic acid of Structure (VIIa) or (VIIb). This chemical imidization agent can catalyze the ring-closing dehydration process of the polyamic acid groups to form imide functionalities on the polymer backbone. If the polyamic acid is isolated after the synthesis, it can be re-dissolved in a compatible solvent. Normally, when a chemical imidization is employed, the imidization reaction takes place without isolation of the polyamic acid.

A suitable dehydrating agent can be used alone or in combination with a non-nucleophilic base to imidize the polyamic acid. Examples of suitable dehydrating agents include, but are not limited to, trifluoromethane sulfonic acid, methanesulfonic acid, p-toluenesulfonic acid, ethanesulfonic acid, butanesulfonic acid, perfluorobutanesulfonic acid, acetic anhydride, propionic anhydride, and butyric anhydride. If used, the non-nucleophilic base employed can be the same as or different from the non-nucleophilic base employed in the end-capping reaction. Examples of suitable non-nucleophilic bases include, but are not limited to, pyridine, triethylamine, tripropylamine, tributylamine, dicyclohexylmethylamine, 2-methylpyridine, 2,6-lutidine, 3,5-lutidine, picoline, 4-dimethylaminopyridine (DMAP) and the like.

In some embodiments, the chemical imidization process is carried out with a suitable dehydrating reagent and a non-nucleophilic base at about 60° C. to about 130° C. for about 6 hours to about 48 hours. The dehydrating agent and non-nucleophilic base can be employed in equimolar concentrations. In another embodiment, the molar ratio of dehydrating agent to non-nucleophilic base is from about 1.1 to about 10 (e.g., from about 1.25 to 5 or from about 1.5 to about 3.0). In one embodiment, about 90 mole % to 200 mole % of a dehydrating agent based on the total amount of the polyamic acid present in the mixture is typically used to complete the imidization reaction. Preferably, 100 mole % to 160 mole % of a dehydrating agent is used to complete the imidization process.

Imidization to form a polyimide of Structure (VIIIa) or (VIIIb) can be confirmed by observation of characteristic absorptions in the infrared spectrum from 1770 and 1700 $cm^{-1}$ attributable to the imide ring structure. In some embodiments, the polymers of this disclosure are at least about 90% (e.g., at least about 95%, at least about 98%, at least about 99, or about 100%) imidized.

The terminal $NH_2$ groups of polymers of Structures (VIIa) and (VIIIa) can be end-capped by reaction with an end-capping compound having a first functional group which is reactive to an amine, and having at least one second functional group selected from a substituted or unsubstituted linear alkenyl group (e.g., a $C_2$-$C_6$ linear alkenyl group) and a substituted or unsubstituted linear alkynyl group (e.g., a $C_2$-$C_6$ linear alkynyl group). Examples of such end-capping compounds include, but are not limited to, acid chloride compounds, dicarboxylic acid anhydrides, epoxide compounds, and isocyanate compounds also containing at least one second functional group selected from a substituted or unsubstituted linear alkenyl group and a substituted or unsubstituted linear alkynyl group. Examples of substituted linear alkenyl groups include, but are not limited to, acrylates, methacrylates, stilbenes, and vinyl ethers. Examples of substituents on linear alkynyl groups include, but are not limited to alkyl (e.g., Me or Et), aryl (e.g., phenyl or substituted phenyl), alkanoyl (e.g., acetyl) and aroyl (e.g., benzoyl).

Examples of compounds having a first functional group reactive to the terminal NH$_2$ groups that also have at least one second functional group selected from a substituted or unsubstituted linear alkenyl group and a substituted or unsubstituted linear alkynyl group include, but are not limited to, the following compounds:

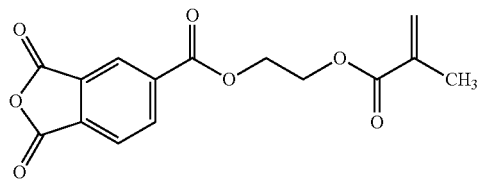
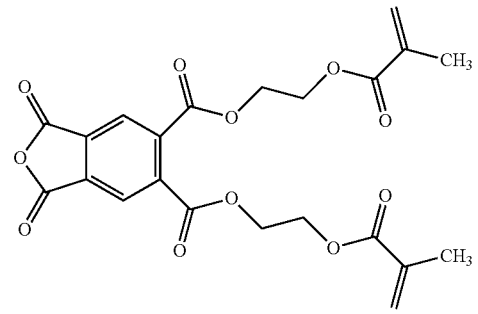
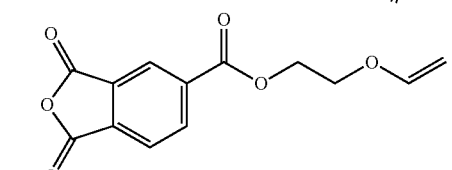
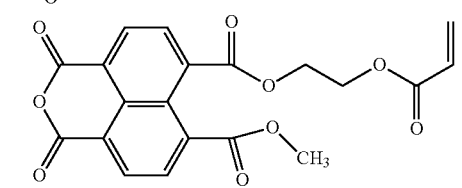
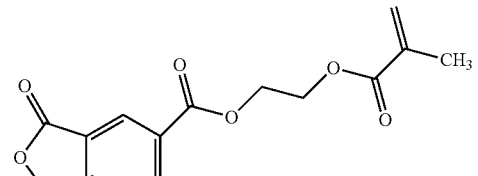
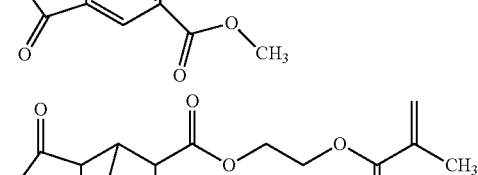
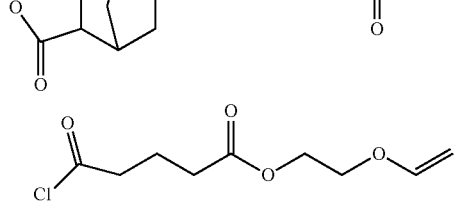
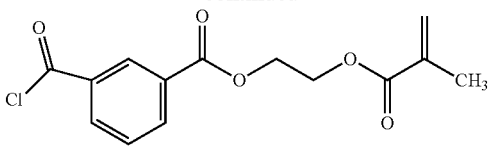
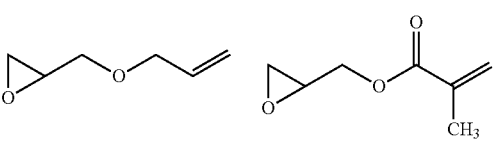
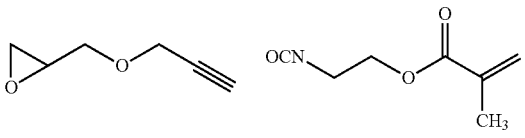
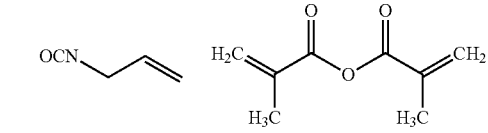
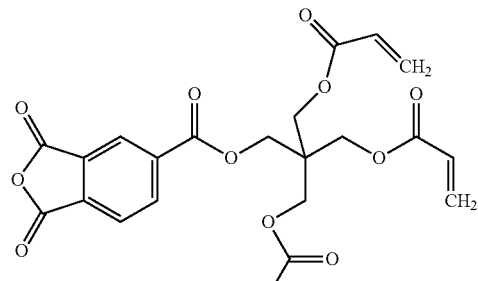

When anhydrides are employed as the reactive functional group with the end-cap with polymers of Structures (VIIa) and (VIIIa), polyamic acids are produced. Polyamic acids terminating polymers of Structure (VIIa) can be imidized when the backbone polyamic acids are imidized. Polyamic acids terminating polymers of Structure (VIIIa) can imidize spontaneously or during isolation and drying, or can easily be imidized with mild heat or with a minimal of dehydrating agent.

The terminal anhydride groups of polymers of Structures (VIIb) and (VIIIb) can be end-capped by reaction with a compound having a first functional group which is reactive with an anhydride, and having at least one second functional group selected from a substituted or unsubstituted linear alkenyl group and a substituted or unsubstituted linear alkynyl group. Examples of such compounds include, but are not limited to, amine compounds, alcohols, and thiols also containing at least one second functional group selected from a substituted or unsubstituted linear alkenyl group and a substituted or unsubstituted linear alkynyl group.

Examples of suitable compounds containing reactive groups meeting these criteria include, but are not limited to, the following compounds:

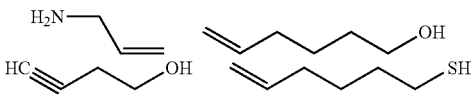

-continued

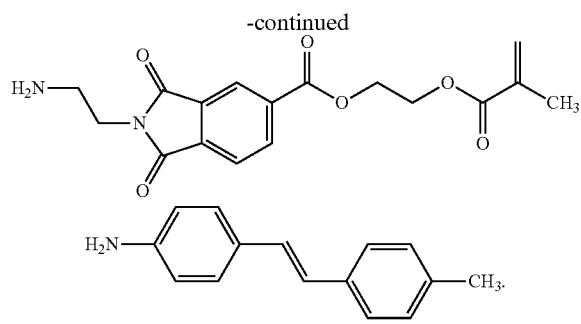

In some cases, a non-nucleophilic base can be used to facilitate the reaction with the terminal anhydride groups. Examples of suitable non-nucleophilic bases include, but are not limited to, pyridine, triethylamine, tripropylamine, tributylamine, dicyclohexylmethylamine, 2-methylpyridine, 2,6-lutidine, 3,5-lutidine, picoline, 4-dimethylaminopyridine (DMAP) and the like.

When the polymers of Structures (VIIb) and (VIIIb) are endcapped with an amine containing compound, a polyamic acid is produced. In this situation, when polymers of Structure (VIIb) are imidized, the endcap is imidized as well. The polyamic acid resulting from the end-capping of polymers of Structure (VIIIb) with an amine containing compound can be isolated having a terminal polyamic acid or can be imidized thermally or chemically.

In some embodiments, the resulting polyimides of the present disclosure can be isolated by precipitation into water and/or an organic solvent, recovered by filtration, and dried. In another embodiment, an indane-containing polyimide of the present disclosure can be isolated by addition of its solution to a combination of water and a suitable water-immiscible solvent. Because of the lower polarity nature of the indane moieties in the polyimide polymer, higher solubility in lower polarity water immiscible solvents allows the polyimide of this disclosure, unlike most polyimides, to be extracted from the higher polarity reaction solvent/water mixture. In another embodiment, an indane-containing polyimide of the present disclosure can be isolated by addition of its solution to a combination of water, a suitable water-immiscible solvent, and a suitable water-miscible solvent. Because of the lower polarity nature of the indane moieties in the polyimide polymer, higher solubility in lower polarity water immiscible solvents allows the polyimide of this disclosure, unlike most polyimides, to be extracted from the higher polarity reaction solvent/water mixture. This extracted polymer solution can be purified by washing with water followed by separation of the water layer, distillation of various volatile compounds, and subsequent extraction into a higher boiling solvent.

The polyimides of this disclosure generally have a CTE of less than about 120 ppm/° C., preferably less than about 80 ppm/° C. and more preferably less than about 60 ppm/° C. and are soluble in organic solvents such as gamma-butyrolactone (GBL), cyclopentanone (CP) and dimethyl sulfoxide (DMSO) and mixtures thereof. In one embodiment, the polyimides of this disclosure have a CTE of about 50 ppm/° C. to about 70 ppm/° C. In one embodiment, the polyimides of this disclosure have a CTE of about 40 ppm/° C. to about 60 ppm/° C. In one embodiment, the polyimides of this disclosure have a CTE of less than about 40 ppm/° C. In addition, generally, polymers of this disclosure have solubility from about 20 grams/100 grams of solvent to about 40 grams/100 grams of a solvent, where the solvent can be GBL, CP, DMSO and/or mixtures thereof.

The polyimides of this disclosure generally have a weight average molecular weight (measured using a polystyrene standard) of from 2000 Daltons to 100,000 Daltons, preferable from 6000 Daltons to 40,000 Daltons, more preferably from 8000 Daltons to 30,000 Daltons.

Description of Compositions

This disclosure also features compositions (e.g., coating or photosensitive resin compositions) containing:

(A) at least one polyimide polymer containing the reaction product (e.g., a condensation and imidization product) of:
  (a) at least one diamine selected from the group consisting of a diamine of Structure (Ia) and a diamine of Structure (Ib),
  (b) at least one diamine of Structure (IIe),
  (c) at least one tetracarboxylic acid dianhydride, and
  (d) at least one compound containing a first functional group reactive with an amine or an anhydride and at least one second functional group selected from a substituted or unsubstituted linear alkenyl group and a substituted or unsubstituted linear alkynyl group;

(B) at least one reactive functional compound (RFC) having at least one functional group capable of reacting with the second functional group on the polyimide polymer in the presence of an activated radical or cationic initiator;

(C) an initiator capable of initiating a reaction between the second functional group on the polyimide polymer and the RFC (in the presence of heat, light, or other radiation); and (D) at least one solvent,

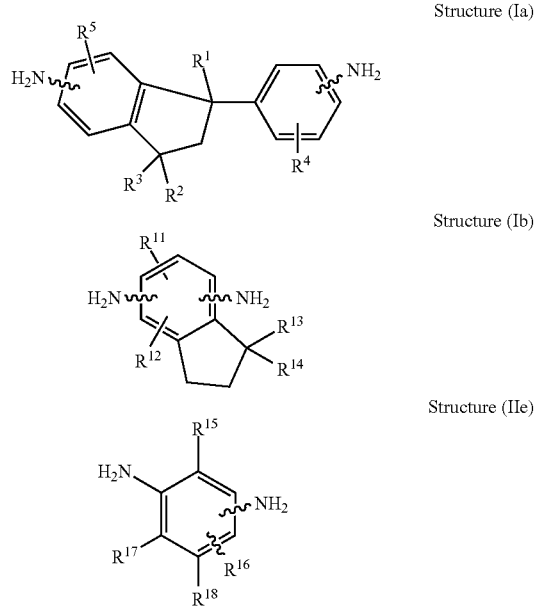

in which each of $R^1$, $R^2$, $R^3$, $R^4$, $R^5$, $R^{11}$, $R^{12}$, $R^{13}$, $R^{14}$, $R^{15}$, $R^{16}$, $R^{17}$ and $R^{18}$, independently, is H, a substituted or unsubstituted $C_1$-$C_6$ linear or branched alkyl group, or $C_5$-$C_7$ cycloalkyl group, provided that at least two of $R^{15}$, $R^{16}$, $R^{17}$ and $R^{18}$ are not hydrogen. In another embodiment of this disclosure, each of $R^{15}$, $R^{16}$, $R^{17}$ and $R^{18}$ in Structure (IIe) is, independently, H or a substituted or unsubstituted $C_1$-$C_6$ linear or branched alkyl group or $C_5$-$C_7$ cycloalkyl group with the proviso that at least three of $R^{15}$, $R^{16}$, $R^{17}$ and $R^{18}$ are not hydrogen.

For those embodiments employing compounds of Structure (IIe) distinct from the compounds of Structure (II), the synthesis of the polyimides in component (A) employed in the composition can be carried out in the same manner as for those containing monomers of Structure (II).

The reactive functional compound (RFC) in component (B) generally possesses at least one functional group capable of reacting with the terminal functional group on the polyimide polymer (e.g., the second functional group on the polyimide polymer described above). The RFC can be a monomer or an oligomer. The oligomer can contain many monomer units and is capable of further reactions to be incorporated in the final material. Examples of such monomer units/oligomers are based on one or more of the following types: acrylate, ester, vinyl alcohol, urethane, urea, imide, amide, carboxazole, carbonate, pyranose, siloxane, urea-formaldehyde and melamine-formaldehyde. The RFC generally contains at least one terminal and/or pendant reactive functional group capable of radical, thermal, or acid catalyzed reaction with the at least one second functional group selected from a substituted or unsubstituted linear alkenyl group and a substituted or unsubstituted linear alkynyl group on the polyimide polymer. In one embodiment, the reactive functional group on the RFC includes an unsaturated double or triple bond.

Suitable examples of reactive functional groups on the RFC include, but are not limited to, a vinyl group, an allyl group, a vinyl ether group, a propenyl ether group, a (meth)acryloyl group, an epoxy group, a —SiH group and a —SH (thiol) group.

In one embodiment, a suitable example of an RFC includes, but is not limited to, a urethane acrylate oligomer. The term urethane acrylate oligomer refers to a class of compounds that contain urethane linkages and have (meth) acrylate (e.g., acrylate or methacrylate) functional groups such as urethane multi(meth)acrylate, multiurethane(meth) acrylate, and multiurethane multi(meth)acrylate. Types of urethane(meth)acrylate oligomers have been described by, for example, Coady et al., U.S. Pat. No. 4,608,409 and by Chisholm et al., U.S. Pat. No. 6,844,950. Other specific examples of RFCs include 1,6-hexanediol di(meth)acrylate, tetraethyleneglycol di(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol tri(meth)acrylate, 1,4-butanediol tri(meth)acrylate, methyl(meth)acrylate, butyl(meth)acrylate, cyclohexyl(meth)acrylate, benzyl(meth)acrylate, neopentyl glycol di(meth)acrylate, (meth)acrylate modified-urea-formaldehyde resins, (meth)acrylate modified melamine-formaldehyde resins and (meth)acrylate modified cellulose.

Examples of RFC compounds containing thiol groups include, but are not limited to, trimethylolpropane tris(mercaptoacetate), pentaerythritol tetrakis(mercaptoacetate), dipentaerythritol hexakis(3-mercaptopropionate), and ethoxylated trimethylolpropane tri-3-mercaptopropionate. Examples of RFC compounds containing vinyl ether groups include, but are not limited to 1,4-butanediol divinyl ether, 1,4-cyclohexanedimethanol divinyl ether, di(ethylene glycol) vinyl ether, poly(ethylene glycol) divinyl ether, and bis[4-(vinyloxy)butyl](4-methyl-1,3-phenylene)biscarbamate. One example of a RFC compound containing a SiH group is octasilane POSS® SH1310 available from Hybrid Plastics. Examples of RFC compounds containing epoxide groups include, but are not limited to, ethylene glycol diglycidyl ether and 1,4-butanediol diglycidyl ether.

The initiator (e.g., photoinitiator) in component (C) used in the composition is a compound that is capable of initiating a reaction between the second functional group on the polyimide polymer and the reactive functional compound, when the composition or a portion of the composition is exposed to light and/or heat. Some initiators used in the composition function by generating free radicals when heated or by absorbing light at the wavelength of exposure. Other initiators used in the composition function by generating acid when heated or by absorbing light at the wavelength of exposure. Other initiators used in the composition function by generating a basic compound when heated or by absorbing light at the wavelength of exposure. An example of a free-radical photoinitiator is 1-hydroxy-cyclohexyl-phenyl-ketone (Irgacure 184) from BASF. An example of a photoactive initiator is a photoacid generator such as triphenyl sulfonium triflate from Aldrich Catalog No. 526940. In some embodiments, the initiators described herein can also catalyze the reaction between the second functional group on the polyimide polymer and the reactive functional compound and therefore also serves as a catalyst.

Specific examples of initiators that generate free radicals when heated include, but are not limited to, benzoyl peroxide, cyclohexanone peroxide, lauroyl peroxide, tert-amyl peroxybenzoate, tert-butyl hydroperoxide, dicumyl peroxide, cumene hydroperoxide, succinic acid peroxide, di(n-propyl)peroxydicarbonate, 2,2-azobis(isobutyronitrile), 2,2-azobis(2,4-dimethylvaleronitrile), dimethyl-2,2-azobisisobutyrate, 4,4-azobis(4-cyanopentanoic acid), azobiscyclohexanecarbonitrile, 2,2-azobis(2-methylbutyronitrile) and the like.

Specific examples of initiators that generate free radicals when exposed to high energy radiation (also known as photoinitiators) include, but are not limited to, NCI-831 (Available from ADEKA Corp.), 1,8-octanedione, 1,8-bis[9-(2-ethylhexyl)-6-nitro-9H-carbazol-3-yl]-1,8-bis(O-acetyloxime), 2-hydroxy-2-methyl-1-phenylpropan-1-one, 1-hydroxycyclohexyl phenyl ketone (Irgacure 184 from BASF), a blend of 1-hydroxycyclohexylphenylketone and benzophenone (Irgacure 500 from BASF), 2,4,4-trimethylpentyl phosphine oxide (Irgacure 1800, 1850, and 1700 from BASF), 2,2-dimethoxyl-2-acetophenone (Irgacure 651 from BASF), bis(2,4,6-trimethyl benzoyl)phenyl-phosphine oxide (Irgacure 819 from BASF), 2-methyl-1-[4-(methylthio)phenyl]-2-morphorinopropane-1-on (Irgacure 907 from BASF), (2,4,6-trimethylbenzoyl)diphenyl phosphine oxide (Lucerin TPO from BASF), ethoxy(2,4,6-trimethylbenzoyl) phenyl phosphine oxide (Lucerin TPO-L from BASF), a blend of phosphine oxide, hydroxy ketone and a benzophenone derivative (ESACURE KTO46 from Sartomer), 2-hydroxy-2-methyl-1-phenylpropane-1-on (Darocur 1173 from Merck), benzophenone, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, dibenzosuberone and the like.

Specific examples of nonionic-type photoactive initiators are (5-toluylsulfonyloxyimino-5H-thiophen-2-ylidene)-2-methylphenyl-acetonitrile (Irgacure 121 from BASF), phenacyl p-methylbenzenesulfonate, benzoin p-toluenesulfonate, (p-toluene-sulfonyloxy)methylbenzoin, 3-(p-toluenesulfonyloxy)-2-hydroxy-2-phenyl-1-phenylpropyl ether, N-(p-dodecylbenzenesulfonyloxy)-1,8-naphthalimide, N-(phenyl-sulfonyloxy)-1,8-napthalimide, bis(cyclohexylsulfonyl)

diazomethane, 1-p-toluenesulfonyl-1-cyclohexylcarbonyldiazomethane, 2-nitrobenzyl p-toluenesulfonate, 2,6-dinitrobenzyl p-toluenesulfonate, and 2,4-dinitrobenzyl p-trifluoromethylbenzenesulfonate and the like.

Specific examples of ionic-type photoactive initiators are triphenyl sulfonium methanesulfonate, triphenyl sulfonium trifluoromethanesulfonate, triphenyl sulfonium nonafluorobutanesulfonate, triphenyl sulfonium perfluorooctanesulfonate, triphenyl sulfonium 4-methyl phenyl sulfonate, 4-methylphenyl-diphenyl sulfonium nonafluorobutanesulfonate, triarylsulfonium bis(trimethylsulfonyl)imide, triarylsulfonium tris(trimethylsulfonyl)methide, diphenyl iodonium hexafluoropropane sulfonate, diphenyl iodonium 4-methylphenyl sulfonate, bis(4-tert-butylphenyl)iodonium trifluoromethane sulfonate, bis(4-tert-butylphenyl)iodonium hexafluoromethane sulfonate, and bis(4-cyclohexylphenyl) iodonium trifluoromethane sulfonate and the like.

Suitable solvents (D) useful in the compositions of this disclosure can include alcohols, ketones, lactones, ethers, amides, imides and esters. The solvent typically should dissolve all components of the composition, cast a good film and should not interfere with the combining reaction (e.g., reaction between components (A) and (B)) of the composition. Suitable examples of organic solvents include, but are not limited to, gamma-butyrolactone (GBL), N-methyl-2-pyrrolidone (NMP), dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylfornamide, diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol 1,4:3,6-dianhydrosorbitol 2,5-dimethyl ether (2,5-dimethylisosorbide), 1,4:3,6-dianhydrosorbitol 2,5-diethyl ether (2,5-diethylisosorbide) and mixtures thereof. Preferred solvents are gamma-butyrolactone (GBL), cyclopentanone (CP), cyclohexanone, 2,5-dimethyl ether (2,5-dimethylisosorbide), ethyl lactate (EL) and dimethylsulfoxide (DMSO). These solvents can be used individually or in combination.

In some embodiments, the amount of polyimide (A) is from at least about 2% by weight (e.g., at least about 5% by weight or at least about 10% by weight) to at most about 50% by weight (e.g., at most about 45% by weight or at most about 45% by weight) of the compositions of the present disclosure.

In some embodiments, the amount of component (B) having at least one reactive functional group is from at least about 1% by weight (e.g., at least about 2% by weight or at least about 5% by weight) to at most about 25% by weight (e.g., at most about 20% by weight or at most about 15% by weight) of the compositions of the present disclosure.

In some embodiments, the amount of component (C) is from at least about 0.001% by weight (e.g., at least about 0.01% by weight or at least about 1% by weight) to at most about 20% by weight (e.g., at most about 15% by weight or at most about 10% by weight) of the compositions of the present disclosure.

In some embodiments, the amount of component (D) is from at least about 40% by weight (e.g., at least about 50% by weight or at least about 60% by weight) to at most about 98% by weight (e.g., at most about 95% by weight or at most about 90% by weight) of the compositions of the present disclosure.

Other additives such as adhesion promoters, surfactants, and plasticizers, but not limited to these, can be added to the composition of this disclosure. The amount of additional additives can range from 0% to about 15% based on the entire weight of the composition.

Suitable adhesion promoters are described in "Silane Coupling Agent" Edwin P. Plueddemann, 1982 Plenum Press, New York. Classes of adhesion promoters include, but are not limited to, vinylalkoxysilanes, methacryloxyalkoxysilanes (e.g., 3-methacryl-oxypropyldimethoxymethylsilane or 3-methacryloxypropyltrimethoxysilane), mercaptoalkoxysilanes, aminoalkoxysilanes, epoxyalkoxysilanes and glycidyloxyalkoxysilanes.

Examples of suitable adhesion promoters which can be employed in the compositions of this disclosure can be described by Structure (XIV):

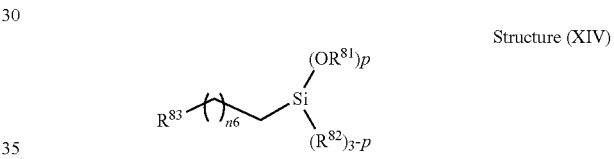

Structure (XIV)

in which each $R^{81}$ and $R^{82}$ are independently a substituted or unsubstituted $C_1$-$C_{10}$ linear or branched alkyl group or a $C_3$-$C_{10}$ cycloalkyl group, p is an integer from 1 to 3 and n6 is an integer from 1 to 6, $R^{83}$ is one of the following moieties:

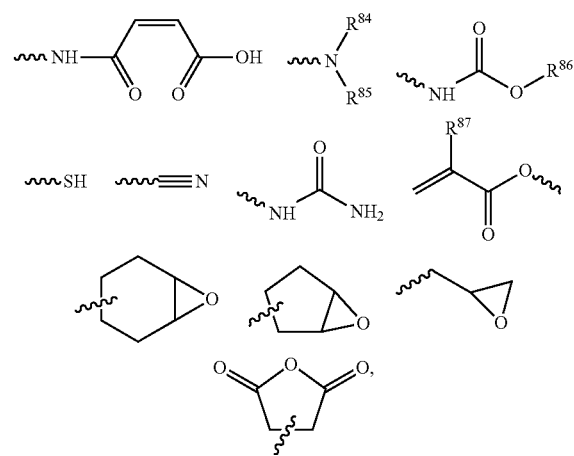

in which each $R^{84}$, $R^{85}$, $R^{86}$ and $R^{87}$, independently, is a $C_1$-$C_4$ alkyl group (or a $C_5$-$C_7$ cycloalkyl group. Preferred adhesion promoters are those (including methacrylate/acrylate) in which $R^{83}$ is selected from:

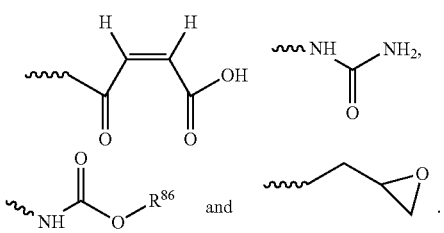

Examples of suitable adhesion promoters having Structure (XIV) include, but are not limited to, gamma-aminopropyltrimethoxysilane, gamma-glycidyloxypropylmethyldimethoxysilane, gamma-glycidyloxypropyl-methyldiethoxysilane, glycidyloxypropyltrimethoxysilane, and gamma-mercaptopropyl-methyldimethoxysilane.

In some embodiments, the adhesion promoter contains a silicon compound without a thiol group. In some embodiments, the adhesion promoter contains a silicon compound without an acrylic moiety. In some embodiments, the adhesion promoter contains a silicon compound without an epoxy group.

The concentration of the optional adhesion promoter, if employed, ranges from at least about 0.1% by weight (e.g., at least about 0.2% by weight or at least about 0.3% by weight) to at most about 5% by weight (e.g., at most about 1.5% by weight or at most about 1% by weight) of the compositions of this disclosure.

The compositions of this disclosure can also optionally contain at least one surfactant. If a surfactant is employed, it can be added from at least about 0.001% by weight (e.g., at least about 0.05% by weight or at least about 0.1% by weight) to at most about 2% by weight (e.g., at most about 1.5% by weight or at most about 1% by weight) of the compositions of this disclosure. Examples of suitable surfactants include, but are not limited to, the surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988.

The compositions of the present disclosure can optionally contain at least one plasticizer. The concentration of the optional plasticizer, if employed, can range from at least about 1% by weight (e.g., at least about 1.5% by weight or at least about 2% by weight) to at most about 10% by weight (e.g., at most about 7.5% by weight or at most about 5% by weight) of the compositions of the present disclosure.

In some embodiments, the compositions of the present disclosure are substantially free of a polymer which forms a discontinuous phase with the polyimide polymer described above. In some embodiments, the compositions of the present disclosure include one or more additional polymers which form a continuous phase with the polyimide polymer(s) described above. Suitable examples of the additional polymers include, but are not limited to, polyamic acids, polyamic esters, polyesters, polyamides, polyhydroxyamides, polyetherimides, polyarylenes, polyethers and polyarylsulfides. These additional polymers may contain reactive groups at their termini and/or along their backbone. In some embodiments, the additional polymer is added in amounts of from at least about 0.5 weight % (e.g., at least about 1 weight % or at least about 5 weight %) to at most about 20 weight % (e.g., at most about 15 weight % or at most about 10 weight %) relative to the polyimide polymer(s).

The present disclosure also features a process of using the compositions described herein to for various purposes. For example, in some embodiments, to form a coated substrate, the process can include the following the steps:
a) coating a substrate with a composition of the present disclosure to form a coated substrate having a film (e.g., a tacky film) on the substrate, and
b) baking the coated substrate (e.g., at a temperature from about 50° C. to about 200° C.) to form a coated substrate having a dried film.

In some embodiments, to form a non-patterned coating substrate, the process can include the following steps:
a) coating a substrate with a composition of the present disclosure to form a coated substrate having a film (e.g., a tacky film) on the substrate;
b) baking the coated substrate (e.g., at a temperature from about 50° C. to about 150° C.) in a first baking step to form a coated substrate having a dried film;
c) exposing the dried film to heat or radiation to form a coated substrate having a dried, exposed film, and
d) optionally, baking the coated substrate having a dried, exposed film (e.g., at a temperature from about 50° C. to about 200° C.) in a second baking step.

In some embodiments, the process is a lithographic process to prepare patterned relief images using the compositions described herein. In such embodiments, the compositions described herein can be used as negative photosensitive resin compositions. In such embodiments, the process can include:
a) coating a substrate with a composition of the present disclosure to form a coated substrate having a film (e.g., a tacky film) on the substrate;
b) baking the coated substrate (e.g., at a temperature from about 50° C. to about 150° C.) in a first baking step to form a coated substrate with a dried film;
c) exposing the dried film to radiation through a mask or a template to form a coated substrate with a dried, pattern-wise exposed film;
d) optionally, baking in a second baking step the coated substrate with a dried, pattern-wise exposed film (e.g., at a temperature from about 50° C. to about 150° C.);
e) developing a portion of the dried, pattern-wise exposed film with a developer (e.g., containing a solvent or a mixture of solvents) to produce a relief image on the substrate, and
f) optionally, rinsing the relief image on the substrate with a solvent or a mixture of solvents, and;
g) optionally, baking the substrate having a relief image (e.g., at a temperature from about 50° C. to about 200° C.) in a third baking step.

In some embodiments, the coating of the substrate can be done by any suitable method, including, but not limited to, spin coating, slit coating, spray coating, dip coating and inkjetting. One skilled in the art will know which coating method is appropriate for a given application.

In some embodiments, the first, second, or third baking step can be done using contact or proximity heating on a hotplate at a fixed temperature or by ramping the temperature at a rate of 1-20° C./minute. In some embodiments, the first, second, or third baking step can be done in an oven at a fixed temperature or by ramping the temperature at a rate of 1-20° C./minute either under vacuum or at atmospheric pressure. Irrespective of the baking method used, the first, second, or third baking step can be performed in either a single or multiple steps. Examples of suitable baking means include, but are not limited to, hotplates, infrared lamps, convection ovens, and thermal heating elements on ink jet printing heads. One skilled in the art will know which baking method is appropriate for a given application.

In some embodiments, the exposure step using light, or other radiation (e.g., ultraviolet light, visible light, electron beam radiation, or X-rays), as is suitable for the initiator in the specific composition. The use of i-line (365 nm), h-line (405 nm), or g-line (436 nm) UV light is preferred. In general, the exposure step can result in the curing or crosslinking of the composition, which is not dissolved in the subsequent developing step. One skilled in the art will know which type of high energy radiation is appropriate for a given application.

In some embodiments, after exposure of the film to light or other radiation through a mask or template, unexposed portions are removed by using a developer to form a pattern. Preferred examples of developers include an organic solvent or a mixture of organic solvents. Suitable examples of organic solvents include, but are not limited to, gamma-butyrolactone (GBL), N-methyl-2-pyrrolidone (NMP), N-ethyl-2-pyrrolidone, N-butyl-2-pyrrolidone, N-formyl-morpholine, dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylformamide, diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol 1,4:3,6-dianhydrosorbitol 2,5-dimethyl ether (2,5-dimethylisosorbide), 1,4:3,6-dianhydrosorbitol 2,5-diethyl ether (2,5-diethylisosorbide) and mixtures thereof. Preferred solvents are gamma-butyrolactone (GBL), cyclopentanone (CP), cyclohexanone, 2,5-dimethyl ether (2,5-dimethylisosorbide), ethyl lactate (EL), n-butyl acetate (nBA) and dimethylsulfoxide (DMSO). These solvent can be used individually or in combination of two or more to improve the image quality.

In some embodiments, the development can be carried out by any suitable method such as spraying the developer described above on the exposed film, immersing the substrate in the developer or applying ultrasonic waves to the substrate while immersing in the developer, spraying the developer while rotating the substrate, or the like. One skilled in the art will know which development method is appropriate for a given application. Development times can range from about 20 seconds to about three minutes. In some embodiments, the development time can range from about 30 seconds to about 2 minutes. In some embodiments, the development time can range from about 45 seconds to about 90 seconds. In some embodiments, multiple development steps can be employed. In some embodiments two or three development steps can be employed. In some embodiments, two or three development steps are employed where each development step takes from about 25 to about 45 seconds.

In some embodiments, after the development, an optional rinse treatment can be carried out with an organic rinse solvent. Suitable examples of organic rinse solvents include, but are not limited to, alcohols such as isopropyl alcohol, methyl isobutyl carbinol (MIBC), propylene glycol monomethyl ether (PGME), amyl alcohol, esters such as n-butyl acetate (nBA), ethyl lactate (EL) and propylene glycol monomethyl ether acetate (PGMEA), ketones such as cyclopentanone (CP), and mixtures thereof. A rinse solvent can be used to carry out the rinse treatment to remove residues.

In some embodiments, the first baking step temperature is from about 50° C. to about 120° C. In some embodiments, the first baking step temperature is from about 70° C. to about 120° C. In some embodiments, the first baking step temperature is from about 80° C. to about 120° C.

In some embodiments, a second baking step can be incorporated before developing. In some embodiments, the second baking step temperature is from about 40° C. to about 150° C. In some embodiments, the second baking step temperature is from about 50° C. to about 120° C. In some embodiments, the second baking step temperature is from about 50° C. to about 110° C.

In some embodiments, a third baking step can be incorporated after developing. In some embodiments, the third baking step temperature is from about 100° C. to about 200° C. In some embodiments, the third baking step temperature is from about 120° C. to about 180° C.

In some embodiments, the thickness of the film formed on a substrate is preferably from 0.5 µm to 200 µm. The appropriate film thickness employed will be determined by the specific application. One skilled in the art will know which film thickness or range of film thicknesses is appropriate.

In general, the process described above can be used to form an article to be used in a semiconductor device. Examples of such articles include a semiconductor substrate, a flexible film for electronics, a wire isolation, a wire coating, a wire enamel, or an inked substrate. Examples of semiconductor devices that can be made from such articles include an integrated circuit, a light emitting diode, a solar cell, and a transistor.

The contents of all publications cited herein (e.g., patents, patent application publications, and articles) are hereby incorporated by reference in their entirety.

Synthesis Example 1 (Poly-1)

The polymerization reaction was performed in a one liter three-neck, jacketed round bottomed flask equipped with a mechanical agitator, a thermocouple and a nitrogen inlet to keep positive nitrogen pressure throughout the reaction. The flask was charged with 59.07 grams of benzophenone-3,3',4,4'-tetracarboxylic dianhydride (BTDA) and 200 grams of anhydrous NMP. The contents were agitated at 18-20° C. 26.64 grams of 1-(4-aminophenyl)-1,3,3-trimethylindan-5-amine, also known as 4,4'-[1,4-phenylene-bis(1-methylethylidene)]bisaniline (DAPI), and 15.02 grams of 2,4-diamino-1,3,5-trimethylbenzene (DAM) were dissolved in 100 grams of dry NMP in a bottle. The diamine solution was added to the flask by pump for 1 hour at room temperature. The mixture was warmed to 60° C. and agitated for 3 hours.

To endcap the polyamic acid formed above, 10.14 grams of 4-methacryloxyethyltrimellitic acid anhydride (META) was charged to the flask. The mixture was agitated at 60° C. for 3 hours.

To perform the imidization reaction, 10.2 grams of acetic anhydride and 3.94 grams of pyridine were charged to the flask. The reaction mixture was warmed to 100° C. and agitated for 12 hours. A small sample (1 g) was withdrawn and precipitated into 50:50 methanol/water (10 ml). The solid was isolated by filtration and dried. FTIR analysis showed that the imidization reaction was complete (showed absence of amide and anhydride peaks).

The solution was cooled to room temperature and added dropwise to 4 liters of vigorously stirred de-ionized water to precipitate the polymer. The polymer was collected by filtration and washed with one liter of de-ionized water. The cake was re-slurried with one liter of methanol and filtered. The wet cake was dried in air for 12 hours and then the polymer was dried under vacuum at 70° C. for 12 hours. The molecular weight of the resultant polyimide polymer (Poly-1) was measured by GPC.

Synthesis Examples 2-4 (Poly-2, Poly-3, and Poly-4)

Polyimides Poly-2, Poly-3, and Poly-4 were synthesized according to the procedure in Synthesis Example 1 except for any variations noted in Table 2.

Synthesis Example 5 (Poly-5)

Polyimide Poly-5 was synthesized according to the procedure in Synthesis Example 1 except that the reagent amounts used were as follows: 30.04 grams of 2,4-diamino-1,3,5-trimethylbenzene (DAM) and 53.28 grams of 4,4'-[1,4-phenylene-bis(1-methylethylidene)]bisaniline (DAPI) in 150 grams of anhydrous NMP, 118.15 grams of benzophenone-3,3',4,4'-tetracarboxylic dianhydride (BTDA) in 168 grams of anhydrous NMP, 10.27 grams of methacrylic anhydride, 7.92 grams of pyridine, and 20.40 grams of acetic anhydride.

Synthesis Example 6 (Poly-6)

Polyimide Poly-6 was synthesized according to the procedure in Synthesis Example 1 except that the reagent amounts used were as follows: 15.02 grams of 2,4-diamino-1,3,5-trimethylbenzene (DAM) and 26.64 grams of 4,4'-[1,4-phenylene-bis(1-methylethylidene)]bisaniline (DAPI) in 100 grams of anhydrous NMP, 70.30 grams of benzophenone-3,3',4,4'-tetracarboxylic dianhydride (BTDA) in 100 grams of anhydrous NMP, 4.78 grams of aminopropyl vinyl ether, 3.96 grams of pyridine, and 10.20 grams of acetic anhydride.

Synthesis Example 7 (Poly-7)

Polyimide Poly-7 was synthesized according to the procedure in Synthesis Example 1 except that the reagent amounts used were as follows: 30.04 grams of 2,4-diamino-1,3,5-trimethylbenzene (DAM) and 53.28 grams of 4,4'-[1,4-phenylene-bis(1-methylethylidene)]bisaniline (DAPI) in 400 grams of anhydrous NMP, 101.82 grams of benzophenone-3,3',4,4'-tetracarboxylic dianhydride (BTDA), 35.09 grams of hexafluoroisopropylidenediphthalic anhydride (6FDA), 3.04 grams of 4-methacryloxyethyltrimellitic acid anhydride (META), 6.61 grams of pyridine, and 40.8 grams of acetic anhydride.

Synthesis Example 8 (Poly-8)

The polymerization reaction was performed in a one liter three-neck, jacketed round bottomed flask equipped with a mechanical agitator, a thermocouple and a nitrogen inlet to keep positive nitrogen pressure throughout the reaction. The flask was charged with 203.7 grams of benzophenone-3,3',4,4'-tetracarboxylic dianhydride (BTDA), 70.2 grams of hexafluoroisopropylidenediphthalic anhydride (6FDA) and 300 grams of anhydrous NMP. The contents were agitated at 18-20° C. 106.55 grams of 1-(4-aminophenyl)-1,3,3-trimethylindan-5-amine (DAPI), and 60.4 grams of 2,4-diamino-1,3,5-trimethylbenzene (DAM) were dissolved in 700 grams of dry NMP in a bottle. The diamine solution was added to the flask by pump for 1 hour at room temperature. The mixture was warmed to 60° C. and agitated for 3 hours to produce a polyamic acid.

To endcap the polyamic acid formed above, 16.5 grams of 3-acryloyloxy-2,2-bis[(acryloyloxy)methyl]propyl 1,3-dioxo-1,3-dihydro-2-benzofuran-5-carboxylate (PETA) and 1.58 g of pyridine were charged to the flask. The mixture was agitated at 60° C. for 3 hours to form an endcapped polyamic acid.

To perform the imidization reaction of the above endcapped polyamic acid, 100.0 grams of acetic anhydride and 35.0 grams of pyridine were charged to the flask. The reaction mixture was warmed to 110° C. and agitated for 12 hours. A small sample (1 g) was withdrawn and precipitated into 50:50 methanol:water (10 ml). The solid was isolated by filtration and dried. FTIR analysis showed that the imidization reaction was complete (showed absence of amide and anhydride peaks).

The solution was cooled to room temperature and added dropwise to 18 liters of vigorously stirred de-ionized water to precipitate the polymer. The polymer was collected by filtration and washed with one liter of de-ionized water. The cake was re-slurried with four liters of methanol and filtered. The wet cake was dried in air for 12 hours and then the polymer was dried under vacuum at 70° C. for 12 hours. The molecular weight of the resultant polyimide polymer (Poly-8) was measured by GPC.

TABLE 2

Information on Polyimides from Synthetic Examples 1-8

| Example | Polymer ID | Diamine of Structure 1 | Diamine of Structure II | Dianhydride | Dianhydride | Diamine/Dianhydride (mole ratio) | end-cap | Mw | Mw/Mn |
|---|---|---|---|---|---|---|---|---|---|
| 1 | Poly-1 | DAPI $R^1 = R^2 = R^3 = CH_3$; $R^4 = R^5 = H$ | DAM $R^{15} = R^{16} = R^{17} = CH_3$; $R^{18} = H$ | BTDA | | 1.09 | META[1] | 12,000 | 3.2 |
| 2 | Poly-2 | DAPI $R^1 = R^2 = R^3 = CH_3$; $R^4 = R^5 = H$ | DAM $R^{15} = R^{16} = R^{17} = CH_3$; $R^{18} = H$ | BTDA | | 1.05 | META[1] | 17,000 | 3.1 |

TABLE 2-continued

Information on Polyimides from Synthetic Examples 1-8

| Example | Polymer ID | Diamine of Structure 1 | Diamine of Structure II | Dianhydride | Dianhydride | Diamine/Dianhydride (mole ratio) | end-cap | Mw | Mw/Mn |
|---|---|---|---|---|---|---|---|---|---|
| 3 | Poly-3 | DAPI $R^1 = R^2 = R^3 = CH_3$; $R^4 = R^5 = H$ | DAM $R^{15} = R^{16} = R^{17} = CH_3$; $R^{18} = H$ | BTDA | PMDA | 1.05 | META[1] | 17,800 | 3.3 |
| 4 | Poly-4 | DAPI $R^1 = R^2 = R^3 = CH_3$; $R^4 = R^5 = H$ | DAM $R^{15} = R^{16} = R^{17} = CH_3$; $R^{18} = H$ | BTDA |  | 1.09 | META[1] | 17,200 | 3.2 |
| 5 | Poly-5 | DAPI $R^1 = R^2 = R^3 = CH_3$; $R^4 = R^5 = H$ | DAM $R^{15} = R^{16} = R^{17} = CH_3$; $R^{18} = H$ | BTDA |  | 1.05 | Methacryl[2] | 17,500 | 3.3 |
| 6 | Poly-6 | DAPI $R^1 = R^2 = R^3 = CH_3$; $R^4 = R^5 = H$ | DAM $R^{15} = R^{16} = R^{17} = CH_3$; $R^{18} = H$ | BTDA |  | 0.92 | Aminopropyl vinyl ether[3] | 10,100 | 3.1 |
| 7 | Poly-7 | DAPI $R^1 = R^2 = R^3 = CH_3$; $R^4 = R^5 = H$ | DAM $R^{15} = R^{16} = R^{17} = CH_3$; $R^{18} = H$ | BTDA | 6-FDA | 1.01 | META[1] | 18,000 | 3.1 |
| 8 | Poly-8 | DAPI $R^1 = R^2 = R^3 = CH_3$; $R^4 = R^5 = H$ | DAM $R^{15} = R^{16} = R^{17} = CH_3$; $R^{18} = H$ | BTDA | 6-FDA | 1.01 | PETA[4] | 32,900 | 3.3 |

[1] Denotes that polyamic acid reacted with 4-methacryloxyethyltrimellitic acid anhydride prior to imidization.
[2] Denotes that polyamic acid reacted with methacrylic anhydride prior to imidization.
[3] Denotes that polyamic acid reacted with aminopropyl vinyl ether prior to imidization.
[4] Denotes that polyamic acid reacted with 3-acryloyloxy-2,2-bis[(acryloyloxy)methyl]propyl 1,3-dioxo-1,3-dihydro-2-benzofuran-5-carboxylate prior to imidization
The molar amount of diamine of Structure I was the same as the diamine of Structure II. In Poly-3 BTDA and PMDA were added in equal molar amount. In Poly 7 and Poly 8 the molar ratio of BTDA/6-FDA was 4:1

Synthesis Example 9 (Alternative Isolation Method for Poly-3)

A solution of DAPI (199.8 g) and DAM (112.7 g) in NMP (574 g) was added slowly by addition pump to a slurry of BTDA (221.5 g) and PMDA (150.0 g) in NMP (1022.5 g) at room temperature. When addition was complete, additional NMP (455 g) was added. After the reaction temperature was increased to 60° C., the mixture was allowed to react for 18 hours. Next, solid 4-methacryloxyethyltrimellitic acid anhydride (76.1 g) and NMP (59 g) were added to the reaction mixture. After an additional 20 hours at 60° C., acetic anhydride (153.4 g) and pyridine (60.1 g) were added, the reaction temperature was increased to 100° C., and the mixture was allowed to react for 15 hours.

The above reaction mixture was cooled to room temperature and 414.4 g of the mixture was transferred to a separatory flask equipped with a mechanical stirrer. The reaction solution was diluted using cyclopentanone and toluene as purification solvents and washed with water for one hour. Stirring was stopped and the mixture was allowed to stand undisturbed. Once phase separation had occurred, the aqueous phase was removed. The organic phase was diluted with cyclopentanone as a purification solvent and washed three more times with water. The amounts of purification solvents (i.e., cyclopentanone and toluene) and water used in all of the washes are shown in Table 3.

The washed organic phase was concentrated by vacuum distillation. Cyclopentanone (378.5 g) was added as an isolation solvent and vacuum distillation was continued. The final polymer solution had a concentration of 31.23 wt %. The NMP content of the final polymer solution was determined by GC to be 0.40 wt % of the polymer.

General Procedure for Making Formulation Examples

Photosensitive composition components as described in the Formulation Examples were mixed in an amber-bottle and a mixture of solvents added to adjust the solid content of the solution and stirred until a homogeneous solution was obtained. The solution was filtered through a 1.0 μm filter into a clean amber-bottle. Table 4 contains information concerning RFC compounds employed in the formulations in Table 5. Ini-1 is NCI-831 (trade name, available from ADEKA Corporation). Ini-2 is diphenyl(2,4,6-trimethylbenzoyl)phosphine oxide.

TABLE 3

|  | Wash 1 | Wash 2 | Wash 3 | Wash 4 |
|---|---|---|---|---|
| Toluene (g) | 410.5 | — | — | — |
| Cyclopentanone (g) | 639.5 | 90.7 | 99.4 | 100.2 |
| Water (g) | 612.1 | 600.9 | 402.5 | 400.8 |

Adhesion Promoters Used in Formulation Examples

AP-1: (3-glycidoxypropyl)triethoxysilane
AP-2: Methacryloxypropyltriethoxysilane

TABLE 4

List of Reactive Functional Compounds (RFCs)

| ID | Name | Structure |
|---|---|---|
| RFC-1 | Tetraethyleneglycol dimethacrylate | |
| RFC-2 | Tricyclo[5.2.1.0$^{2,6}$] decanedimethanol diacrylate | |
| RFC-3 | Tetraethyleneglycol diacrylate | |
| RFC-4 | Pentaerythritol | |

TABLE 5

Formulation Examples FE1-FE10

| Formulation Number | Polymer (g*) | Adhesion Promoter (g) | RFC (g) | Initiator (g) | Solvent 1 (g) | Solvent 2 (g) |
|---|---|---|---|---|---|---|
| FE-1 | Poly-1 (24.0) | AP-1 (0.7) | RFC-1 (9.6) | Ini-1 (0.7) | GBL (58.6) | EL (6.4) |
| FE-2 | Poly-2 (24.0) | AP-1 (0.7) | RFC-1 (9.6) | Ini-1 (0.7) | GBL (58.6) | EL (6.4) |
| FE-3 | Poly-2 (24.0) | AP-1 (0.7) | RFC-1 (9.6) | Ini-1 (0.7) | GBL (58.6) | EL (6.4) |
| FE-4 | Poly-2 (24.0) | AP-1 (0.7) | RFC-2 (9.6) | Ini-1 (0.7) | GBL (58.6) | EL (6.4) |
| FE-5 | Poly-3 (24.0) | AP-1 (0.7) | RFC-1 (9.6) | Ini-1 (0.7) | GBL (58.6) | EL (6.4) |
| FE-6 | Poly-4 (24.0) | AP-1 (0.7) | RFC-1 (9.6) | Ini-1 (0.7) | GBL (58.6) | CP (6.4) |
| FE-7 | Poly-4 (24.0) | AP-1 (0 7) | RFC-1 (9.6) | Ini-1 (0.7) | GBL (65.0) | |
| FE-8 | Poly-5 (24.0) | AP-1 (0.7) | RFC-1 (9.6) | Ini-1 (0.7) | GBL (58.6) | EL (6.4) |
| FE-9 | Poly-5 (24.0) | AP-1 (0.7) | RFC-1 (9.6) | Ini-1 (0.7) | GBL (58.6) | EL (6.4) |
| FE-10 | Poly-8 (20.2) | AP-1 (0.6) | RFC-3 (6.1), RFC-4 (2.0) | Ini-1 (0.6), Ini-2 (0.4) | GBL (70.0) | |

*(g per 100 g formulation)

Preparation of Coated Substrates with
Photosensitive Compositions of the Disclosure A photosensitive composition prepared above was spin coated on either a silicon or silicon dioxide wafer to form a coating with a thickness from about 5 to about 30 microns. The coated wafer was baked at 105° C. for 3 minutes. The photosensitive polyimide film was exposed with a broadband UV exposure tool (Carl Süss MA-56) through a mask having a desired pattern for exposure.

After the exposure, unexposed portions are removed by using a developer as indicated in Table 6 (below), followed by rinsing the developed film with PGMEA to form a pattern. After pattern formation, the developed film was heated at 50° C. for 3 minutes. The resulting film was checked by optical microscope for film defects. The film was heated under $N_2$ atmosphere in a convection oven at 200° C. for 1 hour.

Formulation Examples FE1-FE10 had good solubility in the formulation solvents employed. These formulations yielded coatings of good quality when spin coated on silicon or silicon dioxide wafers. After exposure to the broadband radiation, pattern formation with good resolution (<10 microns) was achieved by development of the films using solvents, such as GBL, CP, or a mixture thereof except for Process Examples 5, which resolved images >10 microns). The test results are summarized in Table 6.

TABLE 6

Process Examples PE1-PE11

| Process Example | Formulation Number | Developer | Resolution (μm) | Comments |
|---|---|---|---|---|
| PE-1 | FE-1 | CP | 7 | good coating quality; no cracking after development |
| PE-2 | FE-2 | CP | 7 | good coating quality; no cracking after development |
| PE-3 | FE-3 | GBL | 5 | good coating quality; no cracking after development |
| PE-4 | FE-3 | GBL/CP (1/1) | 7 | good coating quality; no cracking after development |
| PE-5 | FE-4 | CP | >10 | good coating quality; no cracking after development |
| PE-6 | FE-5 | GBL | 7 | good coating quality; no cracking after development |
| PE-7 | FE-6 | GBL | 7 | good coating quality; no cracking after development |
| PE-8 | FE-7 | GBL | 7 | good coating quality; no cracking after development |
| PE-9 | FE-8 | CP | 7 | good coating quality; no cracking after development |
| PE-10 | FE-9 | GBL | 7 | good coating quality; no cracking after development |
| PE-11 | FE-10 | GBL/CP (7/3) | 3 | good coating quality; no cracking after development |

Formulation Example 11 (FE-11)

A composition was prepared according to general procedure described earlier by using 19 g of polymer (Poly-7), 1.9 g of a polyamic ester shown in Structure PAE-1 below, 0.57 g of adhesion promoter AP-1, 0.57 g of Ini-1, 0.38 g of Ini-2, 5.7 g of RFC-3, 1.9 g of RFC-4 and 71.88 g of GBL.

Structure PAE-1

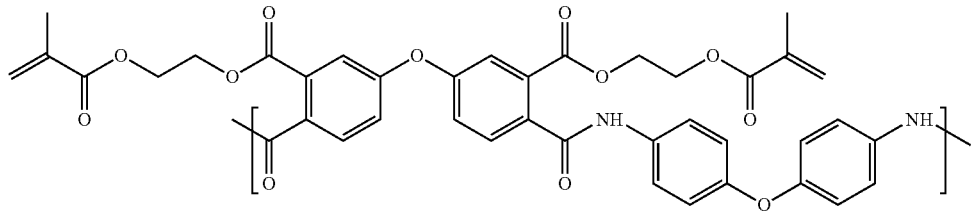

Process Example 12

FE-11 was spin coated on a silicon wafer at a spin speed of 2000 rpm to form a coating with a thickness of 6 microns. The coated wafer was baked on a hot plate at 95° C. for 180 seconds. The temperature was ramped up to 170° C. at a ramp rate of 10 degrees a minute. After reaching 170° C., the wafer was removed from the hot plate and cooled to room temperature. A uniform homogeneous dried film was obtained and no cracking was observed by optical microscope.

Synthesis Example 10 (PAA-1)

The polymerization reaction was performed in a one liter three-neck, jacketed round bottomed flask equipped with a mechanical agitator, a thermocouple and a nitrogen inlet to keep positive nitrogen pressure throughout the reaction. The flask was charged with 26.64 grams of benzophenone-3,3',4,4'-tetracarboxylic dianhydride (BTDA) and 105 grams of anhydrous NMP. The contents were agitated at 18-20° C. 15.02 grams of 2,4-diamino-1,3,5-trimethylbenzene (DAM) and 26.64 grams of 1-(4-aminophenyl)-1,3,3-trimethylindan-5-amine (DAPI) were dissolved in 100 grams of anhydrous NMP in a bottle. The diamine solution was added to the flask by pump for 1 hour at room temperature. The mixture was warmed to 60° C. and agitated for 3 hours. A sample (100 g) was taken out to study mechanical properties of the polyamic acid (PAA-1). The solution was filtered through a 0.2 µm filter into a clean amber-bottle.

Synthesis Example 11 (PAA-2)

The procedure in Synthesis Example 1 was employed except that the reagent amounts used were as follows: 16.97 grams of 2,4-diamino-1,3,5-trimethylbenzene (DAM) and 29.97 grams of 1-(4-aminophenyl)-1,3,3-trimethylindan-5-amine (DAPI) in 100 grams of NMP. 140 grams of anhydrous NMP, 33.02 grams of benzophenone-3,3',4,4'-tetracarboxylic dianhydride (BTDA) and 22.50 grams of pyromellitic dianhydride (PMDA) were added into 1 L jacketed flask. A sample (100 g) was taken out to study mechanical properties of the polyamic acid (PAA-2). The solution was filtered through a 0.2 µm filter into a clean amber-bottle.

Synthesis Example 12 (PAA-3)

The polymerization reaction was performed in a one liter three-neck, jacketed round bottomed flask equipped with a mechanical agitator, a thermocouple and a nitrogen inlet to keep positive nitrogen pressure throughout the reaction. The flask was charged with 59.06 grams of benzophenone-3,3',4,4'-tetracarboxylic dianhydride (BTDA) and 106 grams of anhydrous NMP. The contents were agitated at 18-20° C. 16.43 grams of 2,3,5,6-tetramethyl-1,4-phenylenediamine (aka 1,4-diaminodurene) (DAD) and 26.64 grams of 1-(4-aminophenyl)-1,3,3-trimethylindan-5-amine (DAPI) were dissolved in 100 grams of anhydrous NMP in a bottle. The diamine solution was added to flask by pump for 1 hour at room temperature. The mixture was warmed to 60° C. and agitated for 3 hours. A sample (100 g) was taken out to study mechanical properties of the polyamic acid (PAA-3). The solution was filtered through a 0.2 µm filter into a clean amber-bottle.

Sample Preparation of Polyimide Films from Polyamic Acid Coating for CTE Measurements of Base Polymer The polyamic acid samples prepared above (PAA-1, PAA-2, PAA-3) were individually spin coated on silicon dioxide wafers to form a coating with a thickness from about 5 to about 30 microns. The coated wafers were baked at 120° C. for 3 minutes to dry the coatings. The polyamic acid coatings were heated under $N_2$ atmosphere in a convection oven at 430° C. for 4 hours to convert to the corresponding polyimides. The polyimide coatings (PI-1, PI-2, PI-3) were released from the wafers by treatment with 50:1 water/HF solution. The released coatings were dried under $N_2$ in a dry box for 24 hours.

CTE (coefficient of thermal expansion) and Tg (glass transition temperature) were measured using a TA Instruments Q400 Thermo-Mechanical Analyzer (TMA). Samples were prepared by cutting a three millimeter wide strip of the coating, which was then mounted in the mounting clamps using the 16 mm length setting on the jig. The mounted strip of coating was then placed in the quartz slot and the coating was measured by the tool. Once measurement was completed, the furnace was closed and the temperature ramp was started at 5° C. to 10° C. per minute with the film under 0.2N of force. The furnace ramped until 400° C. was reached. The TMA measured the change in length of the strip versus temperature (° C.) and a plot was created. CTE was calculated by the TMA on the linear sections of the TMA plot from 50° C. to 150° C. (according to ASTM E-831). Tg was defined as the point on the plot where softening of the film occurred resulting in a dramatic increase in dimensional change.

TABLE 7

| CTE and Tg of Polyimides From PAA-1-PAA-3 | | | |
|---|---|---|---|
| Cured Film Property | PI-1 Film | PI-2 Film | PI-3 Film |
| Tg, ° C. | 380 | Over 400 | Over 400 |
| CTE, ppm/° C. | 46 | 47 | 47 |

As shown in Table 7, all of PI-1, PI-2, and PI-3 exhibited low CTE values, suggesting that the base polymers of this disclosure are particularly suitable for use as packaging materials.

Synthesis Examples 13 to Synthesis Example 18 (Poly-9 to Poly-14)

Polymers Poly-9 to Poly-14 are prepared in Synthesis Examples 13 to Synthesis Examples 18 using the procedure described in Synthesis Example 1 except for the differences (e.g., Ia:Ib:II:other diamine ratios, total diamine:dianhydride ratios, and specific endcaps) noted in Table 8.

Synthesis Examples 19 (Poly-15)

Polymer Poly-15 is prepared using the polyamic acid synthesis procedure, end-capping procedure and imidization procedure described in Synthesis Example 1 and using various reagent ratios described in Table 8. The polymer is end-capped by using 2-(vinyloxy)ethyl 5-chloro-5-oxopentanoate prior to imidization. The solution after imidization is cooled to room temperature. The acid chloride end-capping reagent (see Table 8) is dissolved in NMP and slowly added to the reaction mixture. Subsequently, 1.1 equivalents of $Et_3N$ in NMP is slowly added to the reaction mixture. The reaction mixture is allowed to stir for 3 hours and worked up as described in Synthesis Example 1.

TABLE 8

| Synthesis Example | Diamine 1 (Ia or Ib) | Diamine 2 (II) | Diamine 3 | | Dianhydride 1 |
|---|---|---|---|---|---|
| 13 (Poly-9) | 5-amino-6-methyl-1-(3'-amino-4'-methylphenyl)-1,3,3-trimethylindan | 2,3,5,6-tetramethyl-phenylenediamine | | 60%:40% | 2,2-[bis(3,4-dicarboxyphenyl)] hexafluoropropane dianhydride |
| 14 (Poly 10) | 4,7-diamino-1,1-dimethylindan | 2,3,5,6-tetramethyl-phenylenediamine | | 50%:50% | 2,3,3',4'-diphenyl ether tetracarboxylic dianhydride |
| 15 (Poly 11) | 4-amino-6-methyl-1-(3'-amino-4'-methylphenyl)-1,3,3-trimethylindan | 2,4-diamino-3,5-dimethyl-1-ethylbenzene | | 40%:60% | 3,3',4,4'-diphenyl ether tetracarboxylic dianhydride |
| 16 (Poly 12) | 1-(4-aminophenyl)-1,3,3-trimethylindan-5-amine[1] | 2,4-diamino-1,3,5-trimethylbenzene | 5,7-diamino-1,1,6-trimethylindan[1] | 20%:30%:50% | 3,3',4,4'-diphenylsulfone tetracarboxylic dianhydride |
| 17 (Poly 13) | 5-amino-6-methyl-1-(3'-amino-4'-methylphenyl)-1,3,3-trimethylindan | 2,5-Dimethyl-1,4-benzenediamine | | 30%:70% | 2,2-[bis(3,4-dicarboxyphenyl)] hexafluoropropane dianhydride |
| 18 (Poly 14) | 4-amino-6-methyl-1-(3'-amino-4'-methylphenyl)-1,3,3-trimethylindan | 2,4-diamino-1,3,5-trimethylbenzene | 4,4'-oxydianiline | 50%:30%:20% | 2,3,3',4'-diphenyl ether tetracarboxylic dianhydride |
| 19 (Poly 15) | 1-(4-aminophenyl)-1,3,3-trimethylindan-5-amine[1] | 2,3,5,6-tetramethyl-phenylenediamine | o-phenylenediamine | 35%:35%:30% | 3,3',4,4'-diphenyl ether tetracarboxylic dianhydride |

| Synthesis Example | Dianhydride 2 | Total Diamine/Dianhydride ratio | Endcap |
|---|---|---|---|
| 13 (Poly-9) | | 0.95 | (structure: phthalimide with aminoethyl group and methacrylate ester via ethylene glycol linker) |
| 14 (Poly 10) | | 0.93 | HC≡C–CH₂CH₂–OH (but-3-yn-1-ol) |
| 15 (Poly 11) | norbornane-2,3,5,6-tetracarboxylic acid dianhydride, | 0.90 | CH₂=CH–(CH₂)₄–SH (hex-5-ene-1-thiol) |
| 16 (Poly 12) | | 0.87 | H₂N–C₆H₄–CH=CH–C₆H₄–CH₃ (4-amino-4'-methylstilbene) |

TABLE 8-continued

| 17 (Poly 13) | 1.11 | 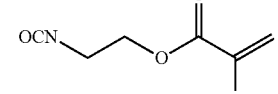 |
| 18 (Poly 14) | 1.08 |  |
| 19 (Poly 15) | 1.06 | 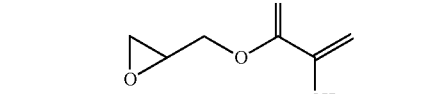 |

[1]This diamine is an example of a diamine of Structure (Ib)

Synthesis Example 20 (Poly-16)

The polymerization reaction is performed in a one liter three-neck, jacketed round bottomed flask equipped with a mechanical agitator, a thermocouple and a nitrogen inlet to keep positive nitrogen pressure throughout the reaction. The flask is charged with 53.16 grams of benzophenone-3,3',4,4'-tetracarboxylic dianhydride (BTDA) and 190 grams of anhydrous NMP. The contents are agitated at 18-20° C. 23.95 grams of 1-(4-aminophenyl)-1,3,3-trimethylindan-5-amine, also known as 4,4'-[1,4-phenylene-bis(1-methylethylidene)]bisaniline (DAPI), 8.11 grams of 2,4-diamino-1,3,5-trimethylbenzene (DAM) and 5.50 grams of 2,4-diamino-3,5-dimethyl-1-ethylbenzene are dissolved in 90 grams of dry NMP in a bottle. The diamine solution is added to the flask by pump for 1 hour at room temperature. The mixture is warmed to 60° C. and agitated for 3 hours to form a polyamic acid.

To endcap the polyamic acid formed above, 9.13 grams of 4-methacryloxyethyltrimellitic acid anhydride (META) is charged to the flask. The mixture is agitated at 60° C. for 3 hours to form an endcapped polyamic acid.

To perform the imidization reaction of the above endcapped polyamic acid, 9.10 grams of acetic anhydride and 3.55 grams of pyridine are charged to the flask. The reaction mixture is warmed to 100° C. and agitated for 12 hours. A small sample (1 g) is withdrawn and precipitated into 50:50 methanol/water (10 ml). The solid is isolated by filtration and dried. If the FTIR analysis shows absence of amide and anhydride peaks, the imidization reaction is complete.

The solution is cooled to room temperature and is added dropwise to 4 liters of vigorously stirred de-ionized water to precipitate the polymer. The polymer is collected by filtration and washed with one liter of de-ionized water. The cake is re-slurried with one liter of methanol and is filtered. The wet cake is dried in air for 12 hours and then the polymer was dried under vacuum at 70° C. for 12 hours. The molecular weight of the resultant polyimide polymer (Poly-16) is measured by GPC.

Synthesis Example 21 (Poly-17)

The polymerization reaction is performed in a one liter three-neck, jacketed round bottomed flask equipped with a mechanical agitator, a thermocouple and a nitrogen inlet to keep positive nitrogen pressure throughout the reaction. The flask is charged with 26.58 grams of benzophenone-3,3',4,4'-tetracarboxylic dianhydride (BTDA), 25.59 grams of 4,4'-oxydiphthalic anhydride (ODPA) and 190 grams of anhydrous NMP. The contents are agitated at 18-20° C. 7.19 grams of 1-(4-aminophenyl)-1,3,3-trimethylindan-5-amine, also known as 4,4'-[1,4-phenylene-bis(1-methylethylidene)] bisaniline (DAPI), 16.77 grams of 5-amino-6-methyl-1-(3'-amino-4'-methylphenyl)-1,3,3-trimethylindan, 5.68 grams of 2,4-diamino-1,3,5-trimethylbenzene (DAM) and 7.86 grams of 2,4-diamino-3,5-dimethyl-1-ethylbenzene are dissolved in 90 grams of dry NMP in a bottle. The diamine solution is added to the flask by pump for 1 hour at room temperature. The mixture is warmed to 60° C. and agitated for 3 hours to form a polyamic acid.

To endcap the polyamic acid formed above, 9.13 grams of 4-methacryloxyethyltrimellitic acid anhydride (META) is charged to the flask. The mixture is agitated at 60° C. for 3 hours to form an endcapped polyamic acid.

To perform the imidization reaction of the above endcapped polyamic acid, 9.10 grams of acetic anhydride and 3.55 grams of pyridine are charged to the flask. The reaction mixture is warmed to 100° C. and agitated for 12 hours. A small sample (1 g) is withdrawn and precipitated into 50:50 methanol/water (10 ml). The solid is isolated by filtration and dried. If FTIR analysis shows absence of amide and anhydride peaks, the imidization reaction is complete.

The solution is cooled to room temperature and is added dropwise to 4 liters of vigorously stirred de-ionized water to precipitate the polymer. The polymer is collected by filtration and washed with one liter of de-ionized water. The cake is re-slurried with one liter of methanol and is filtered. The wet cake is dried in air for 12 hours and then the polymer was dried under vacuum at 70° C. for 12 hours. The molecular weight of the resultant polyimide polymer (Poly-17) is measured by GPC.

Formulation Examples FE-12 to FE-18

Formulation Examples FE-12 to FE-18 are formulated as described in the General Procedure for making Formulation Examples. Formulations Examples FE-12 to FE-18 use 24 g of a polyimide polymer, 10 g of a RFC compound, 1 g of an initiator, and 65 g of a solvent or solvent mixture. The components of FE-12 to FE-18 are described in Table 9.

TABLE 9

| Formulation Example | Polymer | RFC | Initiator | Solvent |
|---|---|---|---|---|
| FE-12 | Poly-9 | ditrimethylolpropane tetra(meth)acrylate | 2,2-azo bis(isobutyronitrile) | 70% GBL/30% PGME |
| FE-13 | Poly-15 | di(ethylene glycol) divinyl ether | triphenyl sulfonium 4-methyl phenyl sulfonate | 75% GBL/25% PGMEA |
| FE-14 | Poly-15 | 1,4-butanediol divinyl ether | bis(cyclohexylsulfonyl)diazomethane | 80% GBL/20% EEP |
| FE-15 | Poly-12 | pentaerythritol tri(meth)acrylate | 1-hydroxycyclohexyl phenyl ketone | 50% GBL/50% DMSO |
| FE-16 | Poly-6 | ethylene glycol diglycidyl ether | triarylsulfonium bis(trimethylsulfonyl)imide | 70% DMSO/30% PGMEA |
| FE-17 | Poly-13 | octasilane POSS® SH1310 | 2,2-dimethoxy-2-acetophenone | GBL |
| FE-18 | Poly-14 | trimethylolpropane tris(mercaptoacetate) | 2-methylthioxanthone | DMSO |

Process Example 13

FE-13 is spin coated on a silicon wafer to form a coating with a thickness from about 5 to about 30 microns. The coated wafer is baked on a hot plate at 120° C. for 60 seconds. The temperature is ramped up to 200° C. at a ramp rate of 10 degrees a minute. After reaching 200° C. the wafer is removed from the hot plate and cooled to room temperature. A uniform homogeneous dried film is obtained and no cracking is observed by optical microscope.

Process Example 14

FE-14 is spin coated on a silicon wafer to form a coating with a thickness from about 5 to about 30 microns. The coated wafer is baked on a hot plate at 110° C. for 90 seconds. The baked wafer is exposed with a broadband UV exposure tool (Carl Süss MA-56). The exposed coated wafer is baked on a hot plate at 130° C. for 90 seconds and cooled to room temperature. A uniform homogeneous dried film is obtained and no cracking is observed by optical microscope.

Process Example 15

FE-16 is spin coated, on a silicon wafer to form a coating with a thickness from about 5 to about 30 microns. The coated wafer is baked on a hot plate at 120° C. for 120 seconds. The baked wafer is exposed with a broadband UV exposure tool (Carl Süss MA-56). The exposed coated wafer is baked on a hot plate at 140° C. for 180 seconds and cooled to room temperature. A uniform homogeneous dried film is obtained and no cracking is observed by optical microscope.

Process Example 16

FE-17 is spin coated, on a silicon wafer to form a coating with a thickness from about 5 to about 30 microns. The coated wafer is baked on a hot plate at 130° C. for 90 seconds. The baked wafer is exposed with a broadband UV exposure tool (Carl Süss MA-56). The exposed coated wafer is baked on a hot plate at 140° C. for 300 seconds and cooled to room temperature. A uniform homogeneous dried film is obtained and no cracking is observed by optical microscope.

Process Example 17

FE-18 is spin coated, on a silicon wafer to form a coating with a thickness from about 5 to about 30 microns. The coated wafer is baked on a hot plate at 150° C. for 60 seconds. The baked wafer is exposed with a broadband UV exposure tool (Carl Süss MA-56). The exposed coated wafer is baked on a hot plate at 130° C. for 240 seconds and cooled to room temperature. A uniform homogeneous dried film is obtained and no cracking is observed by optical microscope.

Process Examples 18 and 19

FE-12 and FE-15 are processed according to Process Example 1. Uniform homogeneous dried films are obtained and no cracking is observed by optical microscope.

Formulation Example FE-19

A composition is prepared according to general procedure described earlier by using 10 g of polymer (Poly-1), 14 g of polymer (Poly-8), 0.3 g of triethoxysilylpropyl carbamate as adhesion promoter, 0.2 g of Ini-1, 0.2 g of Ini-2, 3.2 g of RFC-1, 3.2 g of RFC-2, 3.2 g of RFC-3, 3 g of tripropylene glycol as a plasticizer, 40 g GBL, 15 g cyclopentanone and 15 g cyclohexanone.

Process Example 20

The composition prepared in Formulation Example 19 is spin coated on a silicon wafer to form a coating with a thickness of 7.5 microns. The coated wafer is baked at 115° C. for 3 minutes. The photosensitive polyimide film is exposed with a broadband UV exposure tool (Carl Süss MA-56) through a mask having a desired pattern for exposure. The exposure dose is 450 mJ/cm$^2$. After the exposure, unexposed portions are removed by using a developer containing 80% GBL and 20% cyclopentanone, followed by rinsing the developed film with PGMEA to form a pattern. The developed film is heated at 90° C. for 3 minutes and a 3 micron resolution is achieved. The film is then baked under N$_2$ atmosphere in a convection oven at 170° C. for 1 hour.

What is claimed is:

1. A polyimide polymer, comprising the reaction product of:

(a) at least one diamine, the at least one diamine comprising a diamine of Structure (Ia),

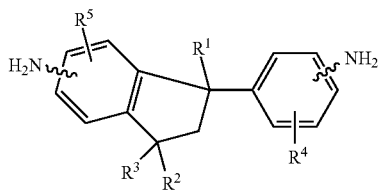

(b) at least one diamine of Structure (II),

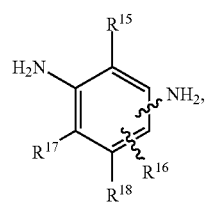

(c) at least one tetracarboxylic acid dianhydride, the at least one tetracarboxylic acid dianhydride comprising 3,3',4,4'-benzophenone tetracarboxylic dianhydride and optionally one or more additional dianhydrides, and (d) at least one compound containing only one first functional group reactive with an amine or an anhydride and at least a second functional group selected from the group consisting of a substituted or unsubstituted linear alkenyl group and a substituted or unsubstituted linear alkynyl group, wherein each of $R^1$, $R^2$, $R^3$, $R^4$, $R^5$, $R^{15}$, $R^{16}$, $R^{17}$ and $R^{18}$, independently, is H or a unsubstituted $C_1$-$C_6$ linear or branched alkyl group, provided that at least three of $R^{15}$, $R^{16}$, $R^{17}$ and $R^{18}$ are not hydrogen, and the polyimide polymer has a coefficient of thermal expansion of from about 40 ppm/° C. to about 60 ppm/° C. at a temperature range of 50° C. to 150° C. and has a solubility of from about 20 grams to about 40 grams per 100 grams in a solvent selected from the group consisting of gamma-butyrolactone, cyclopentanone, and dimethyl sulfoxide.

2. The polymer of claim 1, wherein the amino group on the indane ring in Structure (Ia) is at the 5 position and the other amino group in Structure (Ia) is at the 4 position.

3. The polymer of claim 2, wherein each of R', $R^2$, and $R^3$ is $CH_3$ and each of $R^4$ and $R^5$ is H.

4. The polymer of claim 1, wherein the two amino groups in Structure (II) are at meta positions relative to each other.

5. The polymer of claim 4, wherein each of $R^{15}$, $R^{16}$, and $R^{17}$ is $CH_3$ and $R^{18}$ is H.

6. The polymer of claim 1, wherein the first functional group reactive to an amine comprises an anhydride group, an acid halide group, an epoxy group, or an isocyanate group.

7. The polymer of claim 1, wherein the first functional group reactive to an anhydride comprises an amino group, a hydroxyl group, or a thiol group.

8. The polymer of claim 1, wherein the molar ratio of components (a) and (b) to component (c) ranges from 1.01 to 1.4.

9. The polymer of claim 1, wherein the molar ratio of components (a) and (b) to component (c) ranges from 0.8 to 1.

10. A composition, comprising:
(A) a polyimide polymer, comprising the reaction product of:
(a) at least one diamine the at least one diamine comprising a diamine of Structure

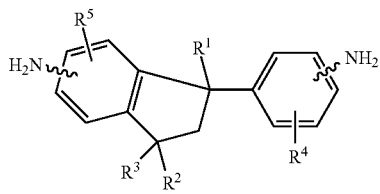

(b) at least one diamine of Structure (IIe),

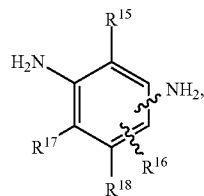

(c) at least one tetracarboxylic acid dianhydride, the at least one tetracarboxylic acid dianhydride comprising 3,3',4,4'-benzophenone tetracarboxylic dianhydride and optionally one or more additional dianhydrides, and (d) at least one compound containing only one first functional group reactive with an amine or an anhydride and at least a second functional group selected from the group consisting of a substituted or unsubstituted linear alkenyl group and a substituted or unsubstituted linear alkynyl group, wherein each of $R^1$, $R^2$, $R^3$, $R^4$, $R^5$, $R^{15}$, $R^{16}$, $R^{17}$ and $R^{18}$, independently, is H or a unsubstituted $C_1$-$C_6$ linear or branched alkyl group, provided that at least three of $R^{15}$, $R^{16}$, $R^{17}$ and $R^{18}$ are not hydrogen, and the polyimide polymer has a coefficient of thermal expansion of from about 40 ppm/° C. to about 60 ppm/° C. at a temperature range of 50° C. to 150° C. and has a solubility of from about 20 grams to about 40 grams per 100 grams in a solvent selected from the group consisting of gamma-butyrolactone, cyclopentanone, and dimethyl sulfoxide;

(B) at least one reactive functional compound having at least one functional group capable of reacting with the second functional group on the polyimide polymer in the presence of an initiator;

(C) an initiator capable of initiating a reaction between the second functional group on the polyimide polymer and the reactive functional compound; and (D) at least one solvent.

11. The composition of claim 10, wherein the amino group on the indane ring in Structure (Ia) is at the 5 aposition and the other amino group in Structure (Ia) is at the 4 position.

12. The composition of claim 11, wherein each of R', $R^2$, and $R^3$ is $CH_3$ and each of $R^4$ and $R^5$ is H.

13. The composition of claim 10, wherein the two amino groups in Structure (IIe) are at meta positions relative to each other.

14. The composition of claim 13, wherein each of $R^{15}$, $R^{16}$, and $R^{17}$ is $CH_3$ and $R^{18}$ is H.

15. The composition of claim 10, wherein the first functional group reactive to an amine comprises an anhydride group, an acid halide group, an epoxy group, or an isocyanate group.

16. The composition of claim 10, wherein the first functional group reactive to an anhydride comprises an amino group, a hydroxyl group, or a thiol group.

17. The composition of claim 10, wherein the molar ratio of components (a) and (b) to component (c) ranges from 1.01 to 1.4.

18. The composition of claim 10, wherein the molar ratio of components (a) and (b) to component (c) ranges from 0.8 to 1.

19. The composition of claim 10, wherein component (B) comprises a vinyl group, an allyl group, a vinyl ether group, a propenyl ether group, a (meth)acryloyl group, an epoxy group, a SiH group, or a thiol group.

20. The composition of claim 10, further comprising an adhesion promoter.

21. The composition of claim 10, further comprising a surfactant.

22. A process, comprising:
coating a substrate with the composition of claim 10 to form a coated substrate having a film on the substrate, and
baking the coated substrate to form a coated substrate having a dried film.

23. The process of claim 22, wherein the coated substrate is baked at a temperature from about 50° C. to about 200° C.

24. The process of claim 22, further comprising exposing the dried film to radiation to form a coated substrate having a dried, exposed film.

25. The process of claim 24, further comprising baking the dried, exposed film at a temperature from about 50° C. to about 150° C. in a second baking step.

26. The process of claim 22, further comprising exposing the dried film to radiation through a mask to form a coated substrate having a dried, patternwise exposed film.

27. The process of claim 26, further comprising baking the dried, patternwise exposed film at a temperature from about 50° C. to about 150° C. in a second baking step.

28. The process of claim 27, further comprising developing a portion of the dried, exposed film in a developer to produce a relief image on the substrate.

29. The process of claim 28, further comprising rinsing the relief image on the substrate with a solvent or a mixture of solvents.

30. The process of claim 29, further comprising baking the substrate having a relief image at a temperature from about 50° C. to about 200° C. in a third baking step.

31. An article formed by the process of claim 22, wherein the article is a semiconductor substrate, a flexible film for electronics, a wire isolation, a wire coating, a wire enamel, or an inked substrate.

32. A semiconductor device, comprising the article of claim 31.

33. The semiconductor device of claim 32, wherein the semiconductor device is an integrated circuit, a light emitting diode, a solar cell, or a transistor.

* * * * *

UNITED STATES PATENT AND TRADEMARK OFFICE
CERTIFICATE OF CORRECTION

PATENT NO. : 10,781,341 B2  
APPLICATION NO. : 14/607233  
DATED : September 22, 2020  
INVENTOR(S) : Sanjay Malik et al.

Page 1 of 1

It is certified that error appears in the above-identified patent and that said Letters Patent is hereby corrected as shown below:

In the Claims

<u>Column 49</u>  
Line 50, in Claim 3, delete "R'," and insert -- $R^1$, --

<u>Column 50</u>  
Line 4, in Claim 10, delete "at least one diamine the at least one diamine" and insert -- at least one diamine, the at least one diamine --  
Line 5, in Claim 10, after "Structure", insert -- (Ia), --  
Line 60, in Claim 11, delete "aposition" and insert -- position --  
Line 63, in Claim 12, delete "R'," and insert -- $R^1$, --

Signed and Sealed this  
First Day of December, 2020

Andrei Iancu  
*Director of the United States Patent and Trademark Office*